(12) United States Patent
Yang et al.

(10) Patent No.: US 11,835,606 B2
(45) Date of Patent: Dec. 5, 2023

(54) DECOUPLED MRI COILS THROUGH COIL MATCHING

(71) Applicant: Quality Electrodynamics, LLC, Mayfield Village, OH (US)

(72) Inventors: Xiaoyu Yang, Indiana, PA (US); Tsinghua Zheng, Chesterland, OH (US); Thomas Eastlake, Cleveland, OH (US); Mathew Finnerty, University Heights, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 54 days.

(21) Appl. No.: 17/503,655

(22) Filed: Oct. 18, 2021

(65) Prior Publication Data

US 2023/0121039 A1 Apr. 20, 2023

(51) Int. Cl.
*G01R 33/36* (2006.01)

(52) U.S. Cl.
CPC ....... *G01R 33/3635* (2013.01); *G01R 33/365* (2013.01); *G01R 33/3642* (2013.01); *G01R 33/3685* (2013.01)

(58) Field of Classification Search
CPC .............. G01R 33/341; G01R 33/3415; G01R 33/3628; G01R 33/3635; G01R 33/3642; G01R 33/365; G01R 33/3657; G01R 33/3685

See application file for complete search history.

(56) References Cited

U.S. PATENT DOCUMENTS

| 4,825,162 | A |   | 4/1989 | Roemer et al. |   |
|---|---|---|---|---|---|
| 5,221,901 | A | * | 6/1993 | Decke | G01R 33/341 324/318 |
| 5,477,146 | A | * | 12/1995 | Jones | G01R 33/34046 324/318 |
| 5,543,713 | A | * | 8/1996 | Arakawa | G01R 33/3685 324/318 |

(Continued)

OTHER PUBLICATIONS

Wang J., "A novel method to reduce the signal coupling of surface coils for MRI," Proc. ISMRM 4:1434 (1996), published in 1996.

(Continued)

*Primary Examiner* — Steven L Yeninas
(74) *Attorney, Agent, or Firm* — Eschweiler & Potashnik, LLC

(57) ABSTRACT

The present disclosure relates to a magnetic resonance imaging (MRI) radio frequency (RF) array coil that includes first and second physical RF coils inductively coupled. A first matching circuit and a second matching circuit are coupled to the first physical RF coil and the second physical RF coil, respectively, and are coupled in a parallel configuration at a first RF port. A third matching circuit and a fourth matching circuit are coupled to the first physical RF coil and the second physical RF coil, respectively, and are coupled in an anti-parallel configuration at a second RF port. A first logical RF coil is formed by the first and second physical RF coils and the first and second matching circuits. A second logical RF coil, which is decoupled from the first logical RF coil, is formed by the first and second physical RF coils and the third and fourth matching circuits.

20 Claims, 13 Drawing Sheets

(56) References Cited

U.S. PATENT DOCUMENTS

| | | | | |
|---|---|---|---|---|
| 5,973,495 | A | * | 10/1999 | Mansfield .............. H01Q 7/005 324/318 |
| 7,091,721 | B2 | | 8/2006 | Jevtic |
| 7,764,065 | B2 | * | 7/2010 | Biber ............... G01R 33/34046 324/318 |
| 2003/0062894 | A1 | * | 4/2003 | Vester ................ G01R 33/3621 324/309 |
| 2005/0140369 | A1 | * | 6/2005 | Feiweier .............. G01R 33/246 324/309 |
| 2018/0263561 | A1 | * | 9/2018 | Jones ............... G01R 33/34007 |
| 2020/0096584 | A1 | * | 3/2020 | Yang ................. G01R 33/3635 |
| 2020/0191889 | A1 | | 6/2020 | Yang |
| 2020/0271739 | A1 | * | 8/2020 | Zhu .................... G01R 33/3664 |
| 2022/0229129 | A1 | * | 7/2022 | Wang ................. G01R 33/3642 |
| 2022/0231656 | A1 | * | 7/2022 | Wang .................... G01R 33/365 |

OTHER PUBLICATIONS

"Quarter-Wavelength Transmission Line" The date of publication is unknown. Retrieved online on Sep. 7, 2021 from https://eng.libretexts.org/Bookshelves/Electrical_Engineering/Electro-Optics/Book%3A_Electromagnetics_I_.

Lee et al. "Coupling and Decoupling Theory and Its Application to the MRI Phased Array" Magnetic Resonance in Medicine 48:203-213 (2002), published in 2002.

* cited by examiner

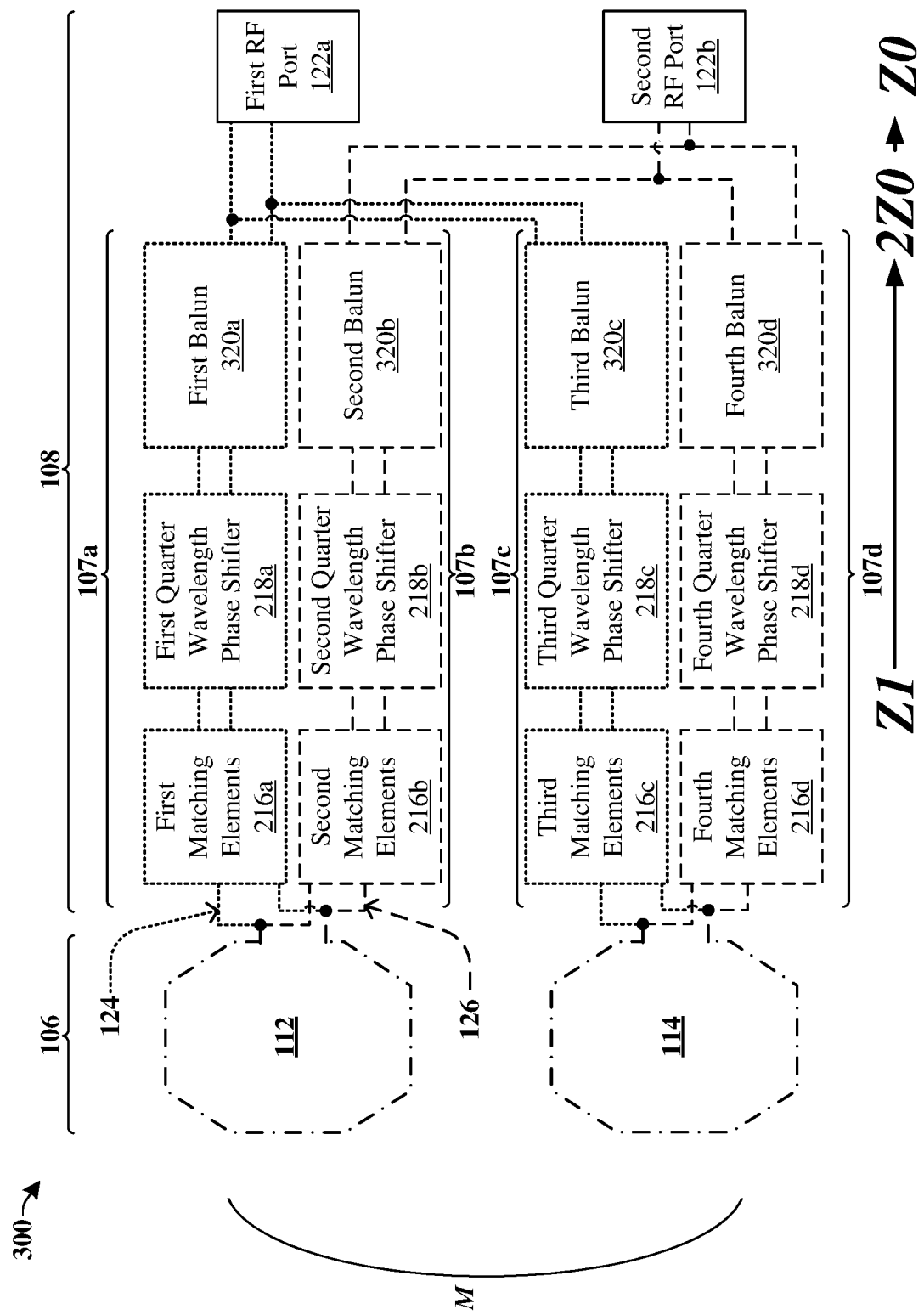

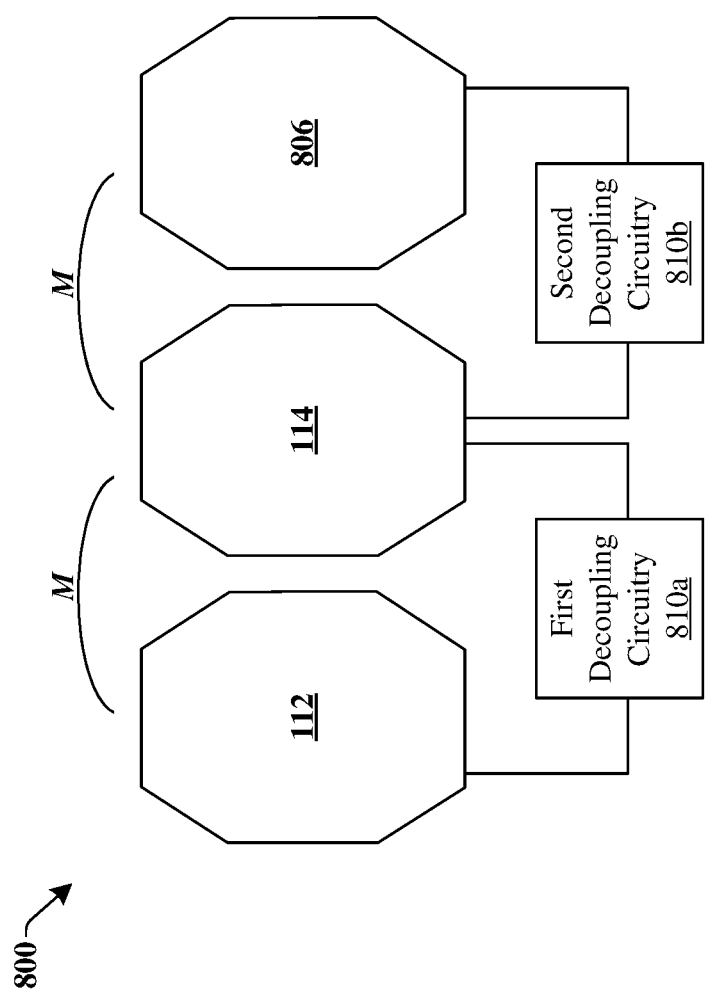

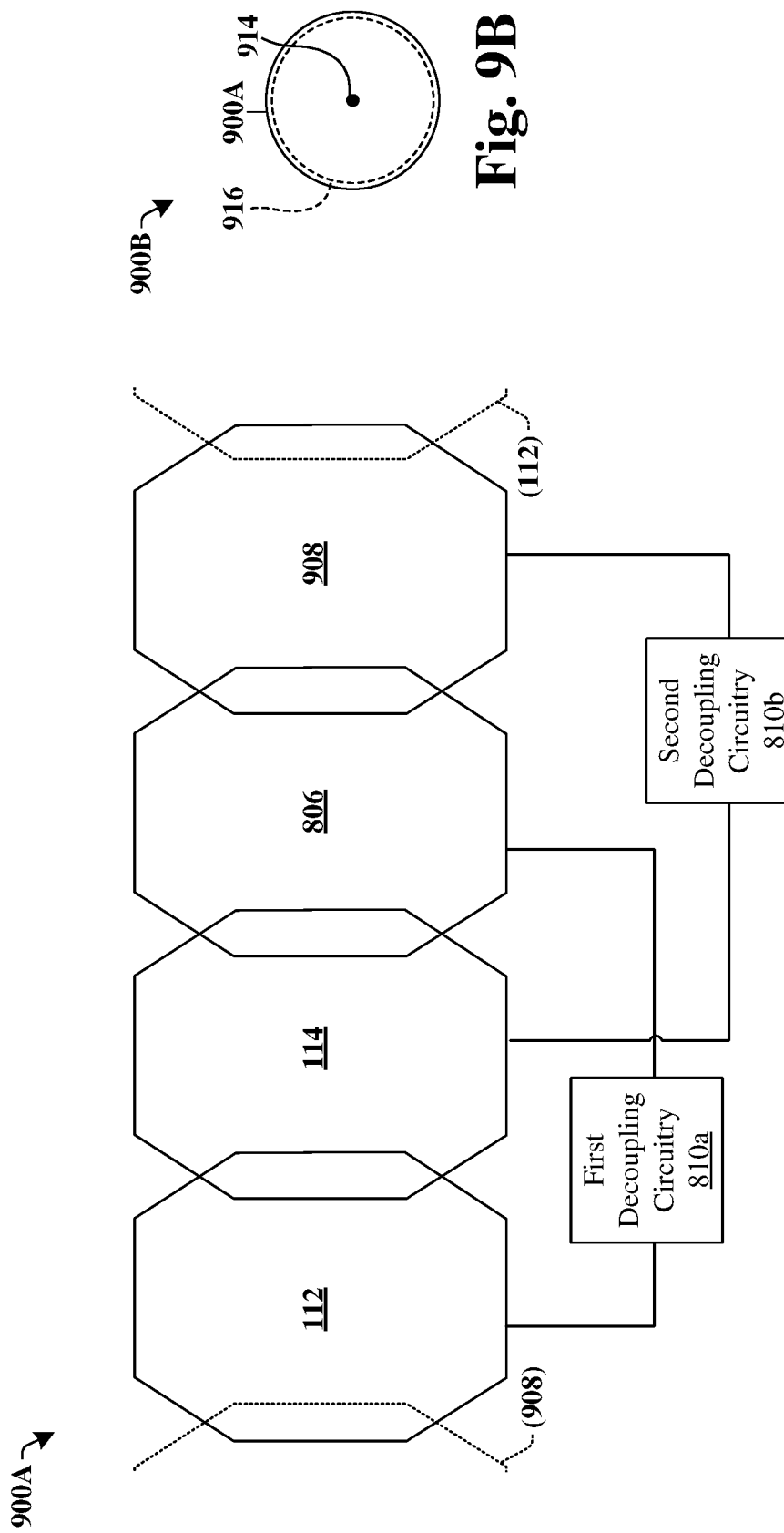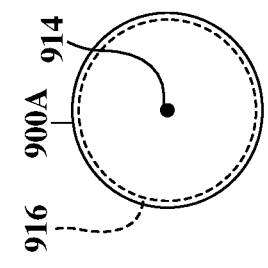
Fig. 9A
Fig. 9B

1100

1102 — Provide a magnetic resonance imaging (MRI) radio frequency (RF) array coil comprising at least: a first physical RF coil inductively coupled to a second physical RF coil, wherein the first and second physical RF coils have a first resonant frequency and a second resonant frequency; first matching circuitry coupling the first and second physical RF coils to a first RF port in a parallel configuration and configured to tune the first frequency to a first desired frequency at the first RF port, and second matching circuitry coupling the first and second physical RF coils to a second RF port in an anti-parallel configuration and configured to tune the second frequency to a second desired frequency at the second RF port

1104 — Perform an MRI imaging process using the MRI RF array coil, wherein the MRI imaging process comprises:

1106 — Arrange a scan object in or proximate to the MRI RF array coil

1108 — Apply a $B_0$ magnetic field to the scan object to align nuclei spinning in the scan object to the $B_0$ magnetic field

1110 — Apply gradient fields to the scan object to select a portion of the scan object

1112 — Apply a $B_1$ magnetic field to the scan object, wherein the $B_1$ magnetic field excites nuclei of the selected portion

1114 — Receive MR signals from the excited nuclei of the selected portion using a receive coil

1116 — Generate an image of the selected portion using the received MRI signals

Fig. 11

DECOUPLED MRI COILS THROUGH COIL MATCHING

BACKGROUND

Magnetic resonance imaging (MRI) involves the transmission and receipt of radio frequency (RF) energy. RF energy may be transmitted by an RF coil to create a $B_1$ field that rotates a net magnetization. Further, resulting magnetic resonance (MR) signals may be received by an RF coil to detect precessing transverse magnetization. Thus, RF coils may be transmit (Tx) coils, receive (Rx) coils, or transmit and receive (Tx/Rx) coils.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4A, and 4B illustrate schematic views of some other embodiments of a MRI RF array coil comprising a first coil element coupled to a second coil element through inductive coupling and also through matching circuits.

FIGS. 8, 9A, and 9B illustrate some embodiments of a MRI RF array coil comprising more than two physical RF coils and decoupling circuitry coupled to the physical RF coils.

FIG. 11 illustrates a flow diagram of some embodiments corresponding to a method of conducting an MRI process using an MRI RF array coil comprising at least two physical RF coils coupled to each other inductively and also through matching circuits.

DETAILED DESCRIPTION

Figure 1A:
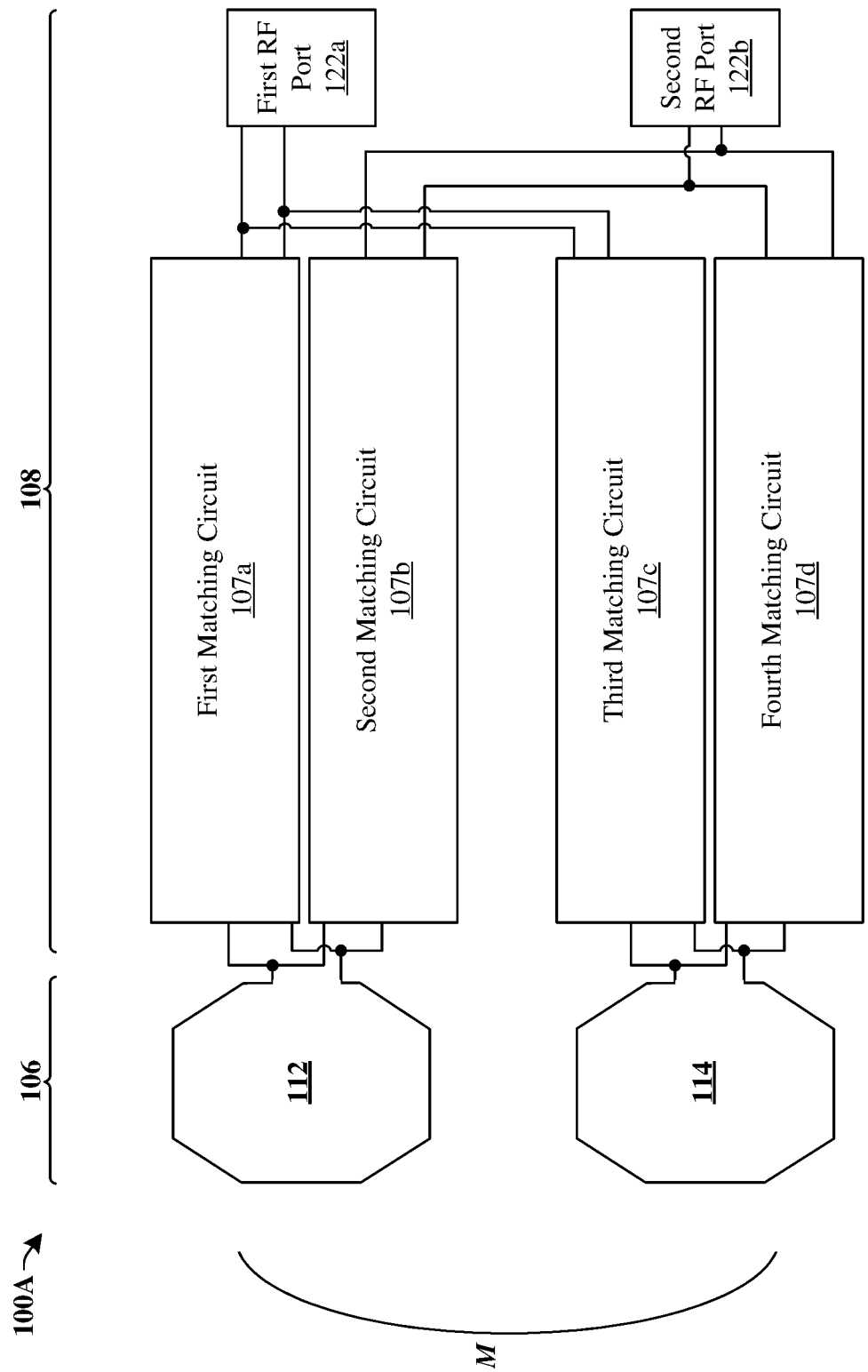
FIGS. 1A and 1B illustrate schematic views of some embodiments of a magnetic resonance imaging (MRI) radio frequency (RF) array coil comprising a first coil element coupled to a second coil element through inductive coupling and also through matching circuits.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Phased array technology is a widely used approach to build a multiple channel magnetic resonance (MR) coil for magnetic resonance imaging (MRI) applications. Phased array technology provides a large-coil-like signal penetration while having the high signal performance of a small coil at a shallow depth. Phased array coils comprise an array of radio frequency (RF) coils or channels configured to receive and/or emit RF signals to produce an MRI image. To improve isolation between two direct neighbor RF coils, the direct neighbor RF coils may be overlapped with one another for minimized mutual inductance. Further, to improve isolation between non-direct neighbor RF coils, a low input impedance preamplifier may be used. However, even with preamplifier decoupling, isolation between non-direct neighbor RF coils with preamplifiers is important for signal-to-noise ratio (SNR).

Besides the overlapping approach, which is one type of a transformer approach, other isolation techniques used to improve the SNR of phased array coils include a capacitor approach to achieve isolation between two RF coils. The capacitor approach allows a capacitor coupled between the two RF coils to resonate with mutual inductance between the two RF coils to cancel the mutual inductance. Further, a more structurally complex capacitor ladder network approach may be used to isolate as many as nine RF coils in a cylindrical arrangement. Yet another approach includes an n-channel phased array coil that connects to n ports of a 2n-port decoupling/coupling matrix. The couplings amongst the n-channels generate non-diagonal terms in the coupling matrix, and the 2n-port decoupling/coupling matrix minimizes the non-diagonal terms to achieve isolation among the channels.

The aforementioned decoupling approaches (e.g., overlapping, preamplifier decoupling, capacitor decoupling, etc.) are within the resonant side of the MRI RF array coil, which is configured to receive and/or emit RF signals. Since RF coils are resonant circuits, the losses from the decoupling approaches, such as transformer losses, decoupling capacitor losses, and trace connection losses, all contribute to the overall RF coil loss. Further, if the additional length of the RF coil traces are large due to these decoupling approaches, then the trace connection losses can significantly contribute to the overall RF coil loss. Accordingly, the decoupling approaches may reduce the SNR if the decoupling noise reduction does not outweigh the increase in overall coil loss from the decoupling approaches.

Various embodiments of the present disclosure relate to a MRI RF array coil comprising a first physical RF coil and a second physical RF coil arranged on the resonant side of the MRI RF array coil. The first and second physical RF coils are inductively coupled together at the resonant side. A first matching circuit and a second matching circuit are coupled to the first physical RF coil. A third matching circuit and a fourth matching circuit are coupled to the second physical RF coil. The first and second physical RF coils are coupled to one another through the first and third matching circuits. The first and third matching circuits are electrically coupled in a parallel configuration at a first RF port. The first and second physical RF coils are also coupled to one another through the second and fourth matching circuits. The second and fourth matching circuits are electrically coupled in an anti-parallel configuration at a second RF port. Because of the mutual inductance between the first and second physical RF coils, the first and second physical RF coils resonate together at a first frequency and a second frequency. The first and second frequencies are different, and may not equal a working frequency, absent tuning.

The first physical RF coil, the second physical RF coil, the first matching circuit, and the third matching circuit together form a first logical RF coil that has a first current pattern configured to produce first magnetic fields. The first physical RF coil, the second physical RF coil, the second matching circuit, and the fourth matching circuit together form a second logical RF coil that has a second current pattern configured to produce second magnetic fields. As seen hereafter, the first and second magnetic fields are such that decoupling occurs between the first and second logical RF coils.

The first logical RF coil resonates at the first frequency, and the second logical RF coil resonates at the second frequency. Further, the first and third matching circuits are configured to tune the first frequency to equal or to be closer to the working frequency at the first RF port, and the second and fourth matching circuits are configured to tune the second frequency to equal or to be closer to the working frequency at the second RF port.

Because decoupling is performed on the matching side, coil loss from decoupling is reduced. Because the first and second logical RF coils are decoupled and because coil loss is reduced, noise is reduced. Because the matching circuits tune the first and second logical RF coils to resonate at the same or similar working frequencies, signal is increased. With a reduced noise, the overall SNR is increased to produce an improved MRI image.

FIG. 1A illustrates a schematic view 100A of some embodiments of a MRI RF array coil comprising first and second physical RF coils inductively coupled to one another and physically coupled to one another through matching circuitry.

The MRI RF array coil of FIG. 1A includes a first physical RF coil 112 and a second physical RF coil 114 inductively coupled to the first physical RF coil 112 through mutual inductance M. The first and second physical RF coils 112, 114 are each arranged at a resonant side 106 of the MRI RF array coil and are configured to receive and/or emit RF signals. The first and second physical RF coils 112, 114 each comprise a conductive wire or trace (e.g., copper) arranged in one or more loops or coils or saddles and also comprises various circuit elements such as capacitors, inductors, diodes, or the like. In some embodiments, the wires or traces of the first and second physical RF coils 112, 114 are each a continuous wire or trace.

The first and second physical RF coils 112, 114 are coupled to one another through matching circuitry (107a, 107b, 107c, 107d) at the matching side 108 of the MRI RF array coil. Due to its arrangement on the matching side 108 of the MRI RF array coil instead of the resonant side 106, the matching circuitry (107a, 107b, 107c, 107d) does not significantly contribute to noise of the MRI RF array coil.

The first physical RF coil 112 is coupled to a first matching circuit 107a and a second matching circuit 107b. The second physical RF coil 114 is coupled to a third matching circuit 107c and a fourth matching circuit 107d. In some embodiments, the matching circuits 107a-d may comprise, for example, matching capacitors, matching inductors, quarter wavelength phase shifters, baluns, or the like.

Further, the first matching circuit 107a and the third matching circuit 107c respectively couple the first physical RF coil 112 and the second physical RF coil 114 to a first RF port 122a. The second matching circuit 107b and the fourth matching circuit 107d respectively couple the first physical RF coil 112 and the second physical RF coil 114 to a second RF port 122b.

The first, second, third, and fourth matching circuits 107a-d each comprise a pair of resonant-side terminals and a pair of port-side terminals. The resonant-side terminals of the first and second matching circuits 107a, 107b are electrically coupled in parallel, and the resonant-side terminals of the third and fourth matching circuits 107c, 107d are also electrically coupled in parallel. The port-side terminals of the first and third matching circuits 107a, 107c are electrically coupled in parallel (e.g., a parallel configuration), and the port-side terminals of the second and fourth matching circuits 107b, 107d are electrically coupled in anti-parallel (e.g., an anti-parallel configuration). In some embodiments, the resonant-side terminals may be regarded as input terminals, whereas the port-side terminals may be regarded as output terminals. Such embodiments may, for example, arise when the MRI RF array coil is used in receive mode. In other embodiments, the resonant-side terminals may be regarded as output terminals, whereas the port-side terminals may be regarded as input terminals. Such embodiments may, for example, arise when the MRI RF array coil is used in transmit mode. The physical RF coils (112, 114) and the matching circuitry (107a, 107b, 107c, 107d) together form logical RF coils to improve the SNR of the MRI RF array coil as will be described further in FIG. 1B.

Figure 1B:
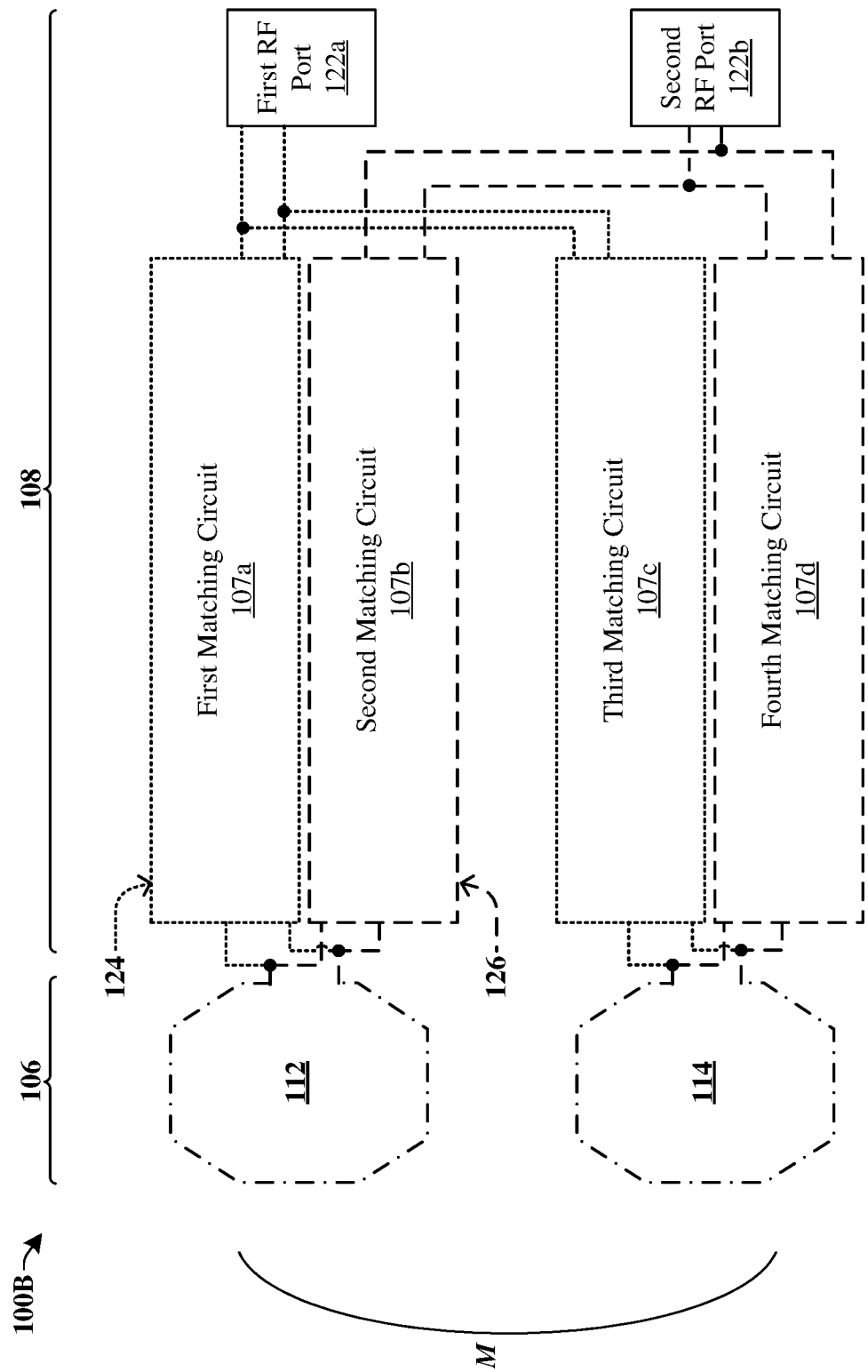

FIG. 1B illustrates a schematic view 100B of some embodiments of logical RF coils formed within the MRI RF coil array of FIG. 1A.

The first physical RF coil 112, the first matching circuit 107a, the third matching circuit 107c, and the second physical RF coil 114 together form a first logical RF coil 124. The first physical RF coil 112, the second matching circuit 107b, the fourth matching circuit 107d, and the second physical RF coil 114 together form a second logical RF coil 126. Thus, for ease of understanding, elements (112, 107a, 107c, 114) of the first logical RF coil 124 are illustrated with a dotted line, and elements (112, 107b, 107d, 114) of the second logical RF coil 126 are illustrated with a hashed line. Because the first and second physical RF coils 112, 114 are a part of both the first and second logical RF coils 124, 126, the first and second physical RF coils 112, 114 are illustrated with both hashed and dotted lines.

Because the first logical RF coil 124 is coupled to the first RF port 122a in the parallel configuration, the first logical RF coil 124 has a first current pattern. Because the second logical RF coil 126 is coupled to the second RF port 122b in the anti-parallel configuration, the second logical RF coil 126 has a second current pattern. The second current pattern is different than the first current pattern, and the first and second current patterns are such that the first and second logical RF coils 124, 126 are decoupled.

Because of the mutual inductance M between the first and second physical RF coils 112, 114, the first and second physical RF coils 112, 114 resonate together at a first frequency and a second frequency different than the first frequency. Further, because the first and third matching circuits 107a, 107c are coupled together in the parallel configuration, and the second and fourth matching circuits 107b, 107d are coupled together in the antiparallel configuration, the first and second logical RF coils 124, 126 can simultaneously operate respectfully at the first and second frequencies. The first logical RF coil 124 may have the first frequency, whereas the second logical RF coil 126 may have the second frequency.

The first and second physical RF coils 112, 114 have individual resonant frequencies when decoupled (e.g., mutual inductance is zero) from each other and any other coils. In some embodiments, the individual resonant frequencies are the same as each other, but are different than the first and second resonant frequencies at which the first and second physical RF coils 112, 114 resonate together. In other embodiments, the individual resonant frequencies are different than each other and are different than the first and second resonant frequencies at which the first and second physical RF coils 112, 114 resonate together.

For reliable performance of the MRI RF array coil, the matching circuits (107a, 107b, 107c, 107d) are configured to tune the first and second frequencies to match a working frequency of the MRI RF array coil. The working frequency may, for example, correspond to a Larmor frequency for MR or some other suitable frequency. Further, the RF ports 122a, 122b are configured to receive a desired impedance from the first and second logical RF coils 124, 126. It has been appreciated that the first and second frequencies depend on matching impedance. Therefore, the first and second frequencies are tuned by the matching circuitry (107a, 107b, 107c, 107d) such that the first and second logical RF coils 124, 126 resonate at the same working frequency and also have the desired impedance at the first and second RF ports 122a, 122b for reliable performance of the MRI RF array coil.

Figure 2:
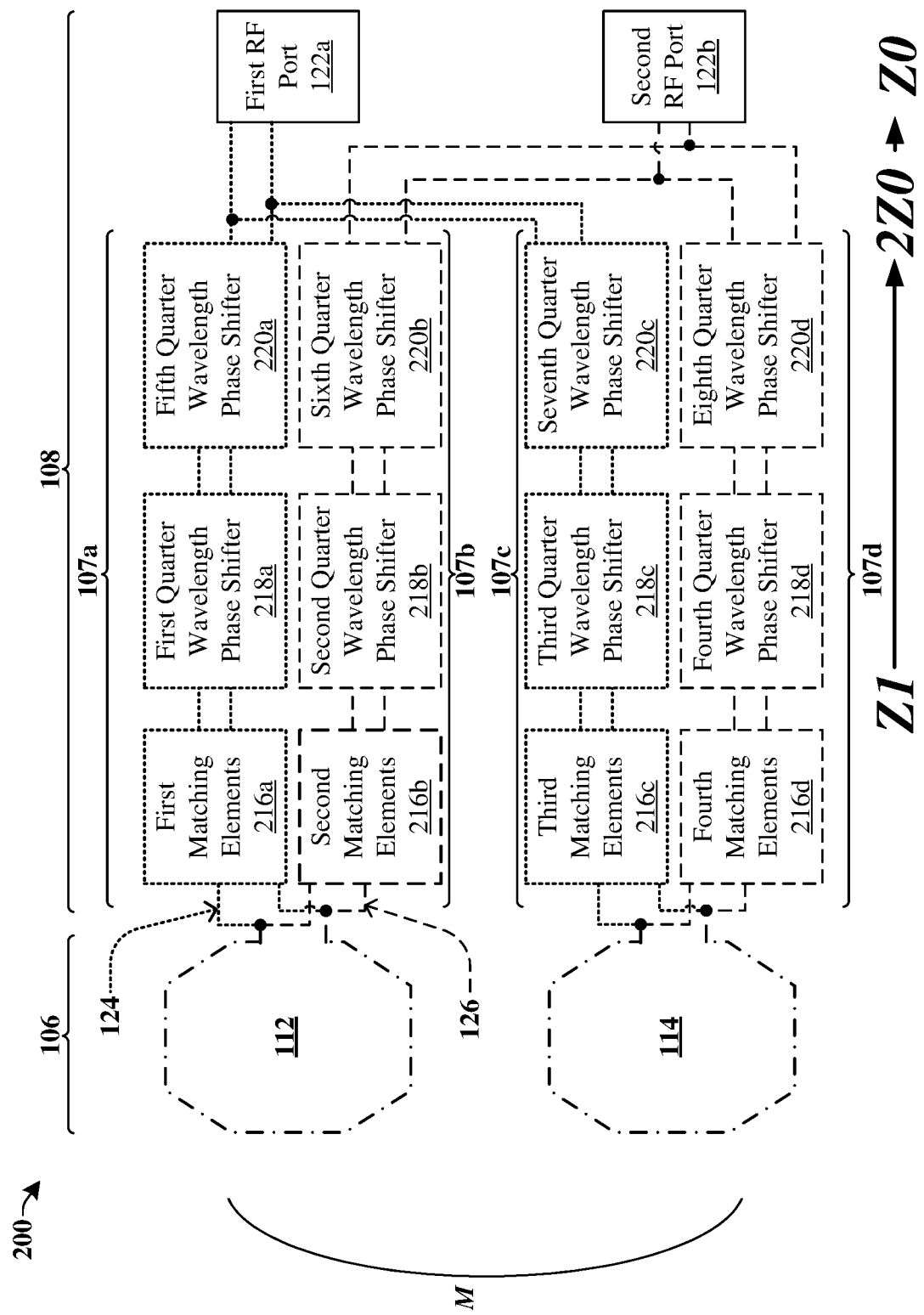

FIG. 2 illustrates a schematic view 200 of some other embodiments of an MRI RF array coil comprising first and second physical RF coils coupled to first and second RF ports through matching circuits.

The first matching circuit 107a may comprise first matching elements 216a coupled to the first physical RF coil 112, a first quarter wavelength phase shifter 218a, and a fifth quarter wavelength phase shifter 220a. The second matching circuit 107b may comprise second matching elements 216b coupled to the first physical RF coil 112, a second quarter wavelength phase shifter 218b, and a sixth quarter wavelength phase shifter 220b. The third matching circuit 107c may comprise third matching elements 216c coupled to the second physical RF coil 114, a third quarter wavelength phase shifter 218c, and a seventh quarter wavelength phase shifter 220c. The fourth matching circuit 107d may comprise fourth matching elements 216d coupled to the second physical RF coil 114, a fourth quarter wavelength phase shifter 218d, and an eighth quarter wavelength phase shifter 220d. The fifth quarter wavelength phase shifter 220a and the seventh quarter wavelength phase shifter 220c are coupled to the first RF port 122a in the parallel configuration, while the sixth quarter wavelength phase shifter 220b and the eighth quarter wavelength phase shifter 220d are coupled to the second RF port 1222b in the anti-parallel configuration.

The matching elements (216a, 216b, 216c, 216d) have individual initial impedances Z1 based on the first and second resonant frequencies. In other words, the impedances seen respectively by the first, second, third, and fourth quarter wavelength phase shifters 218a-d are the initial impedances Z1. The initial impedances Z1 may, for example, correspond to input or output impedances of the matching elements (216a, 216b, 216c, 216d) depending on whether the MRI RF array coil is in receive (Rx) mode or transmit (Tx) mode.

It has been appreciated that the initial impedances Z1 may be employed to tune the first and second resonant frequencies to the working frequency. In some embodiments, the initial impedances Z1 respectively of the first matching elements 216a and the third matching elements 216c are the same, and/or the initial impedances Z1 respectively of the second matching elements 216b and the fourth matching elements 216d are the same but different than the initial impedances Z1 respectively of the first matching elements 216a and the third matching elements 216c. In other embodiments, the initial impedance Z1 may be different amongst each of the matching elements (216a-d).

The initial impedances Z1 are translated by the quarter wavelength phase shifters (218a-d, 220a-d) to equal two-times a desired impedance Z0 (represented as "2Z0" in FIG. 2) at the first and second RF ports 122a, 122b. In contrast with the initial impedances Z1, which can be different amongst the matching elements (216a, 216b, 216c, 216d), the desired impedance Z0 is common to the matching elements (216a, 216b, 216c, 216d).

In some embodiments, the first, second, third, and fourth quarter wavelength phase shifters (218a-d) provide the full impedance translation, such that the impedances seen respectively by the fifth, sixth, seventh, and eighth quarter wavelength phase shifters (220a-d) are two-times the desired impedance Z0 (represented as "2Z0" in FIG. 2). In such embodiments, the fifth, sixth, seventh, and eighth quarter wavelength phase shifters (220a-d) provide no change in impedance from inputs to outputs. In other embodiments, the first, second, third, and fourth quarter wavelength phase shifters (218a-d) provide a partial impedance translation, and the fifth, sixth, seventh, and eighth quarter wavelength phase shifters (220a-d) provide a partial impedance translation, that collectively lead to two-times the desired impedance Z0 (represented as "2Z0" in FIG. 2).

Because of the parallel and antiparallel configurations of the matching circuitry (107a, 107b, 107c, 107d) respectively at the first and second RF ports 122a, 122b, the first and second RF ports 122a, 122b see the desired impedance Z0. The parallel combination of two impedances (e.g., corresponding to the first and third matching circuits 107a, 107c) sharing a common value (e.g., 2Z0) leads to a halving of the common value. Likewise, the antiparallel combination of two impedances (e.g., corresponding to the second and fourth matching circuits 107b, 107d) sharing a common value (e.g., 2Z0) leads to a halving of the common value.

In alternative embodiments, instead of translating the initial impedances Z0 to two-times a desired impedance Z0, the quarter wavelength phase shifters (218a-d, 220a-d) translate the initial impedances Z1 to different impedances that lead to the desired impedance Z0 when combined in parallel and antiparallel. Two impedances (e.g., Z' and Z") in parallel or antiparallel lead to a total impedance (e.g., ZT) according to the following equation: $1/ZT=1/Z'+1/Z"$. Therefore, as an example, the first matching circuit 107a may translate the corresponding impedance to impedance Z', and the third matching circuit 107c may translate the corresponding impedance to impedance Z", such that ZT equals the desired impedance Z0. As another example, the second matching circuit 107b may translate the corresponding impedance to Z', and the fourth matching circuit 107d may translate the corresponding impedance to Z", such that ZT equals the desired impedance Z0.

In some embodiments, the first and second RF ports 122a, 122b may each comprise, or otherwise be coupled to an input of, a low impedance preamplifier for Rx mode, such that the low impedance preamplifier sees the desired impedance. Further, in some embodiments, the first and second RF ports 122a, 122b may each comprise, or otherwise be coupled to, an output of an RF power amplifier for Tx mode, such that the RF power amplifier sees the desired impedance. The desired impedance Z0 corresponds to a predetermined impedance requirement of the first and second RF ports 122a, 122b. In some embodiments, for example, the desired impedance Z0 may be equal to 25 Ohms, 50 Ohms, 100 Ohms, or some other suitable value.

In some embodiments, each matching circuit (107a-d) comprises two quarter wavelength phase shifters (218a-d, 220a-d) so that the signals traveling through each matching circuit (107a-d) undergo a total phase shift that is 180 degrees or an integer multiple of 180 degrees. This improves the matching circuits (107a-d) performance in a Rx mode for preamplifier decoupling. In some embodiments, each quarter wavelength phase shifter (218a-d, 220a-d) individually provides a 90-degree phase shift.

FIG. 3 illustrates a schematic view 300 of yet some other embodiments of an MRI RF array coil comprising first and second physical RF coils coupled to first and second RF ports through matching circuits.

In some other embodiments, the matching circuits (107a-d) each comprise a balun (320a-320d) instead of the second quarter wavelength phase shifter (220a-d of FIG. 2). Thus, in some embodiments, the first matching circuit 107a comprises the first matching elements 216a, the first quarter wavelength phase shifter 218a, and a first balun 320a; the second matching circuit 107b comprises the second matching elements 216b, the second quarter wavelength phase shifter 218b, and a second balun; the third matching circuit 107c comprises the third matching elements 216c, the third quarter wavelength phase shifter 218c, and a third balun; and the fourth matching circuit 107d may comprise the fourth matching elements 216d, the fourth quarter wavelength phase shifter 218d, and a fourth balun 320d.

In some embodiments, the baluns (320a-d) are configured to enforce the current flow by allowing differential mode signal flow and minimizing common mode current flow to sustain the current configurations of the first and second logical RF coils 124, 126. In some embodiments, the baluns (320a-d) also include quarter wavelength phase shifters such that the phase of the signal is shifted another 90 degrees in the baluns (320a-d) to achieve an overall phase shift in each matching circuit (107a-d) that is 180 degrees or that is an integer multiple of 180 degrees.

In some embodiments, the baluns (320a-d) are lattice baluns to provide the quarter wavelength phase shifter function and the balun function. It will be appreciated that other approaches than baluns (320a-320d) may be used to replace the second quarter wavelength phase shifters (220a-d of FIG. 2) such that the matching circuits (107a-d) can each provide impedance conversions, balun functions, and phase shifting (e.g., a phase shift that is 180 degrees or an integer multiple of 180 degrees). For example, in some other embodiments, instead of the quarter wavelength phase shifters (218a-d) in FIG. 3, solenoid baluns and phase shifters may be used, and then second quarter wavelength phase shifters, such as 220a-d of FIG. 2, may be used in place of the baluns (320a-d) in FIG. 3. In yet some other embodiments, the matching circuits (107a-d) may each comprise the matching elements (216a-d), solenoid baluns, and phase shifters to create a zero-degree phase shifter during the impedance translation. In some embodiments, the phase shifters (e.g., 218a-d, 220a-d of FIG. 2) may be or comprise Pi or T type lumped element phase shifters or transmission lines.

Figure 4A:
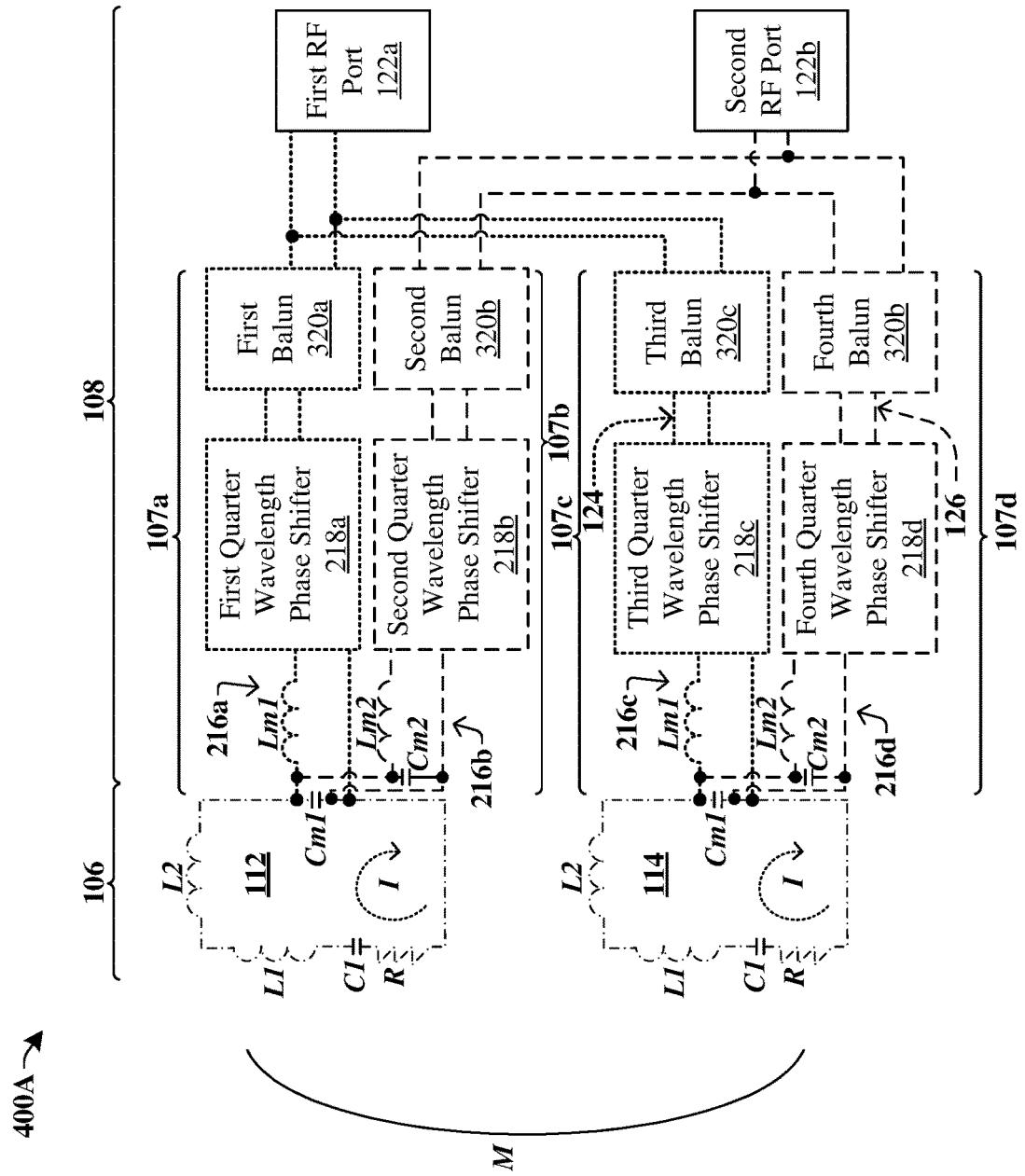

FIG. 4A illustrates a schematic view 400A of some other embodiments of an MRI RF array coil that illustrates exemplary circuitry for the matching elements and physical RF coils.

In some embodiments, the first physical RF coil 112 and the second physical RF coil 114 each comprise a breaking point capacitor C1, coil loss R (modeled as a resistor), a first coil trace inductor L1, and a second coil trace inductor L2. The breaking point capacitor C1 is configured to resonate with the first coil trace inductor L1 at a resonant frequency $\omega_0$. In some embodiments, the breaking point capacitor C1 is fixed and/or the first physical and second physical RF coils 112, 114 are devoid of variable capacitors. The coil loss R includes conductor loss, capacitor loss, phantom loss, and radiation loss.

In some embodiments, the first matching elements 216a and the third matching elements 216c each comprise a first matching inductor Lm1 and a first matching capacitor Cm1. In some embodiments, the second matching elements 216b and the fourth matching elements 216d each comprise a second matching inductor Lm2 and a second matching capacitor Cm2. In some embodiments, the second coil trace inductor L2 has the same inductance as the first matching inductor Lm1 and/or the second matching inductor Lm2. In some embodiments, the first and second physical RF coils 112, 114 are identical.

For simplicity, the matching function of the matching circuits (107a-d) on the matching side 108 of the MRI RF array coil will hereafter be explained by first focusing on the first physical RF coil 112, the first matching elements 216a, the first quarter wavelength phase shifter 218a, and the first balun 320a, while ignoring all other elements of the MRI RF array coil. However, it is to be appreciated that the explanation is equally application to: 1) the first physical RF coil 112, the second matching elements 216b, the second quarter wavelength phase shifter 218b, and the second balun 320b; 2) the second physical RF coil 114, the third matching elements 216c, the third quarter wavelength phase shifter 218c, and the third balun 320c; and 3) the second physical RF coil 114, the fourth matching elements 216d, the fourth quarter wavelength phase shifter 218d, and the fourth balun 320d.

The first and second coil trace inductors L1, L2 of the first physical RF coil 112 together make up the total trace inductance of the first physical RF coil 112. Therefore, the sum of the first and second coil trace inductors L1, L2 is a fixed value equal to the total inductance of the first physical RF coil 112. In some embodiments, the second coil trace inductor L2, the first matching capacitor Cm1, and the first coil matching inductor Lm1 create a quarter wavelength transmission line with a matching impedance Zm. In some embodiments, the second coil trace inductor L2 and the first coil matching inductor Lm1 have a same inductance. The matching impedance Zm at the resonant frequency $\omega_0$ is represented by Equation 1:

$$Zm = jw_0 Lm1 = -\frac{j}{\omega_0 Cm1} \qquad \text{Eq. 1}$$

Since the first coil trace inductor L1 and the breaking point capacitor C1 resonate with each other at the resonant frequency $\omega_0$, their impedances cancel each other out at the resonant frequency $\omega_0$. Further, the first matching elements 216a (Cm1, Lm1) and the second coil trace inductor L2 create a quarter wavelength transmission line that transforms the coil loss R to an impedance Z1 (e.g., the initial impedance in FIGS. 2 and 3), which is represented by Equation 2:

$$Zm^2 = Z1 * R \qquad \text{Eq. 2}$$

When a sum of the first coil trace inductor L1 and the second coil trace inductor L2 is represented by a total inductance L, the resonant frequency $\omega_0$ is represented by Equation 3 based on the quarter wavelength transmission line impedance matching:

$$\omega_0 = \frac{\sqrt{Z1R}\,C1 + \sqrt{Z1RC1^2 + 4C1L}}{2C1L} \qquad \text{Eq. 3}$$

The coil loss R and the total inductance L in Equation 3 are fixed. In some embodiments, the mutual inductance M contributes to the total inductance L, as well. Further, if the breaking point capacitor C1 is equal to a fixed value, then the resonant frequency $\omega_0$ is a function to the impedance Z1 in Equation 3. Therefore, according to Equation 3, the resonant frequency $\omega_0$ of the first physical RF coil 112 can be tuned by adjusting the impedance Z1 at the first matching circuit 107a instead of adjusting the structure of the first physical RF coil 112. For example, the resonant frequency $\omega_0$ may be tuned to the working frequency.

When using the impedance Z1 to tune the resonant frequency $\omega_0$, the impedance Z1 may not be suitable to achieve two times a desired impedance Z0 (e.g., 2Z0) at the first RF port 122a (see FIG. 2). Therefore, in some embodiments, the first matching elements 216a are coupled to the first quarter wavelength phase shifter 218a which is configured to translate the impedance Z1 to two-times the desired impedance value Z0 according to Equation 4, wherein Z2 is equal to the intrinsic impedance value of the first quarter wavelength phase shifter 218a:

$$Z2^2 = 2Z0 * Z1 \qquad \text{Eq. 4}$$

The first balun 320a electrically couples to the first quarter wavelength phase shifter 218a and sees the translated impedance (e.g., 2Z0). Further, an input impedance of the first balun 320a is the same as an output impedance of the first balun 320a. In some embodiments, the first balun 320a is a lattice balun and also includes a quarter wavelength phase shifter. In some embodiments, the quarter wavelength phase shifter within the first balun 320a has an intrinsic impedance equal to two times the desired impedance Z0 (e.g., 2Z0) such that the input impedance of the first balun 320a remains equal to the output impedance of the first balun 320a.

The first quarter wavelength phase shifter 218a and the first balun 320a each provide a 90-degree phase shift for a signal passing between the first physical RF coil 112 to the first RF port 122a. This prevents reflections that reduce SNR.

In other embodiments, an input impedance of the first quarter wavelength phase shifter 218a is equal to an output impedance of the first quarter wavelength phase shifter 218a, such that the first balun 320a sees the impedance Z1. Further, the first balun 320a translates the impedance Z1 to two-times the desired impedance value Z0 (e.g., 2Z0). In yet other embodiments, the first quarter wavelength phase shifter 218a translates the impedance Z1 to an intermediate impedance, and the first balun 320a translates the intermediate impedance to two-times the desired impedance value Z0 (e.g., 2Z0). In some embodiments, the first quarter wavelength phase shifter 218a and the wavelength phase shifter of the first balun 320a have different intrinsic impedance values. In other embodiments, the first quarter wavelength phase shifter 218a and the wavelength phase shifter of the first balun 320a have the same intrinsic impedance values.

As discussed above, because of the parallel connection of impedances respectively of the first and third matching circuits 107a, 107c, which are individually equal to the two-times the desired impedance value 2Z0, the first RF port 112a sees the desired impedance Z0. Further, in alternative embodiments, the individual impedances of the first and third matching circuits 107a, 107c at the first RF port 112a may be different so long as the parallel combination of the impedances leads to the desired impedance Z0.

Further, in some embodiments, before the first physical RF coil 112 is inductively coupled to the second physical RF coil 114, the first and second physical RF coils 112, 114 may have individual resonant frequencies that are the same. In other embodiments, before the first physical RF coil 112 is inductively coupled to the second physical RF coil 114, the first and second physical RF coils 112, 114 may have individual resonant frequencies that are different. Nevertheless, the matching circuits 107a-d are configured to tune the resonant frequencies of the first and second physical RF coils 112, 114 via impedance and to translate impedance to achieve the desired impedance Z0 at the first and second RF ports 122a, 112b.

Now, all elements of FIG. 4A will be discussed to show how decoupling of the first physical RF coil 112 and the second physical RF coil 114 is achieved using the first and second logical RF coils 124, 126. It has been appreciated that when two coils are placed near one another, a mutual inductance forms between the two coils, which causes the two coils to resonate together at two different resonant frequencies.

In FIG. 4A, the first physical RF coil 112 has a mutual inductance M with the second physical RF coil 114. Further, as mentioned previously, the first and second physical RF coils 112, 114 each have a fixed total trace inductance L equal to the sum of the first and second coil trace inductors L1, L2. The mutual inductance M can be rewritten as k*L, wherein k is the coupling coefficient between the total trace inductance L of the first physical RF coil 112 and the total trace inductance L of the second physical RF coil 114. The coil losses R are not important for the discussion and will be ignored. Because of the mutual inductance M between the first and second physical RF coils 112, 114, the first and second physical RF coils 112, 114 resonate together at two resonant frequencies that may be represented by Equation 5:

$$f_0 = \frac{1}{2\pi\sqrt{(L \pm M)C1}} \qquad \text{Eq. 5}$$

Supposing the matching side 108 of the MRI RF array coil is not present, current flows in the same direction (e.g., clockwise) in the first and second physical RF coils 112, 114 when operating together at the first resonant frequency. On the other hand, current flows in opposite directions (e.g., clockwise vs. counterclockwise) in the first and second physical RF coils 112, 114 when operating together at the second resonant frequency.

If the first and second physical RF coils 112, 114 are identical and have current I of the same magnitude that flows in the same direction (e.g., clockwise as illustrated by the dotted arrows in the first and second physical RF coils 112, 114), then the magnetic fields created by the first and second physical RF coils 112, 114 are additive. For example, in some embodiments, the magnetic energy produced by the first and second physical RF coils 112, 114 is equal to ½(2M+2L)I², whereby the inductance of the first and second physical RF coils 112, 114 is 2L+2M. Therefore, magnetic fields of the first and second physical RF coils 112, 114 may be additive when operating together at the first resonant frequency.

If, however, the first physical RF coil 112 has the current I flowing in a first direction (e.g., clockwise), whereas the second physical RF coil 114 has the current I flowing in a second, opposite direction (e.g., counter-clockwise), then the magnetic fields created by the first and second physical RF coils 112, 114 are subtractive. For example, in some embodiments, the magnetic energy produced by the first and second physical RF coils 112, 114 is equal to ½(2M−2L)I², whereby the inductance of the first and second physical RF coils 112, 114 is equal to 2L−2M. Therefore, magnetic fields of the first and second physical RF coils 112, 114 may be subtractive when operating together at the second resonant frequency.

Because inductance of the first and second physical RF coils 112, 114 is different at the first and second resonant frequencies (e.g., 2L+2M vs. 2L−2M), the first and second physical RF coils 112, 114 have two coil configurations. At a first coil configuration, the first and second physical RF coils 112, 114 resonant together at the first resonant frequency. At a second coil configuration, the first and second physical RF coils 112, 114 resonate together at the second resonant frequency. Further, because the two coil configurations have different inductances, the two coil configurations may be treated as RF coils.

Supposing the two coil configurations are treated as RF coils, the second coil configuration (e.g., the coil configuration with an inductance of 2L−2M) may induce a magnetic flux in the first coil configuration (e.g., the coil configuration with an inductance of 2L+2M). However, because current in the second coil configuration has opposite directions respectively in the first and second physical RF coils of the second coil configuration, the magnetic flux induced in the first coil configuration by the first physical RF coil of the second coil configuration has an opposite sign and an equal magnitude as the magnetic flux induced in the first coil configuration by the second physical RF coil of the second coil configuration. Therefore, the mutual fluxes cancel and the mutual inductance between the first and second coil configurations is zero. In other words, the first and second coil configurations are decoupled.

In view of the foregoing, decoupling may be achieved by recreating the current patterns of the first and second coil configurations. By electrically coupling the first and third matching circuits 107a, 107c in a parallel configuration, and the second and fourth matching circuits 107b, 107d in an antiparallel configuration, the current patterns respectively of the first and second coil configurations may be recreated. The first logical RF coil 124 has the current pattern of the first coil configuration, and the second logical RF coil 126 has the current pattern of the second coil configuration. Further, the first and second current patterns produce magnetic fields that result in decoupling of the first and second logical RF coils 124, 126. Further, the first logical RF coil 124 operates at the first resonant frequency, and the second logical RF coil 126 operates at the second resonant frequency.

The above discussion assumes the first and second physical RF coils 112, 114 are identical. For example, L1, L2, C1, and R are the same in the first physical RF coil 112 and the second physical RF coil 112. However, in alternative embodiments, the first and second physical RF coils 112, 114 may be different. In such embodiments, decoupling between the first and second logical RF coils 124, 126 may still be achieved if a first current in the first physical RF coil 112 and a second current in the second physical RF coil 114 have an appropriate ratio.

Figure 4B:
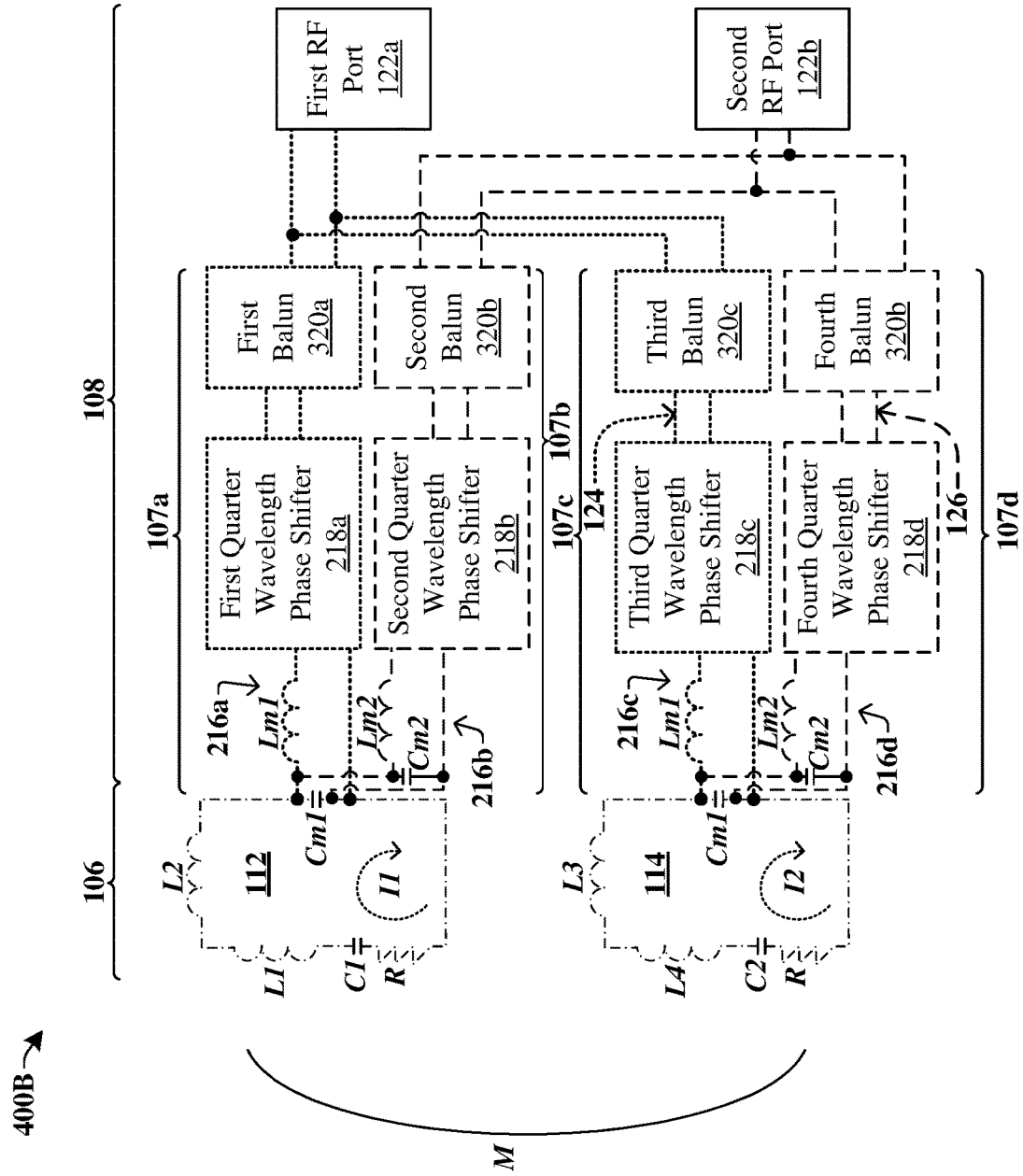

FIG. 4B illustrates a schematic view 400B of some other embodiments of the MRI RF array coil of FIG. 4A in which the first and second physical RF coils 112, 114 are different. For example, in some such embodiments, the second physical RF coil 114 may have a third coil trace inductor L3 and a fourth coil trace inductor L4 that are different that the first and second coil trace inductors L1, L2 of the first physical RF coil 112. In some such embodiments, a first current I1 flowing through the first physical RF coil 112 is different than a second current I2 that flows through the second physical RF coil 114.

Supposing the matching side 108 of the MRI RF array coil is not present, whereby the first and second physical RF coils 112, 114 form a first coil configuration and a second coil configuration as above, a ratio of the first current I1 to the second current I2 may be tuned to achieve decoupling between the first and second coil configurations.

The first physical RF coil of the second coil configuration may receive induced voltage from the first coil configuration as follows:

$$V_{coil2\_conf2}=j\omega*L1*I1+j\omega*M*I2 \qquad \text{Eq. 6}$$

Further, the second physical RF coil of the second coil configuration may receive induced voltage from the first coil configuration as follows:

$$V_{coil2\_conf2}=-j\omega*L2*I2-j\omega*M*I1 \qquad \text{Eq. 7}$$

When the two voltages ($V_{coil1\_conf2}$ and $V_{coil2\_conf2}$) respectively of Equation 6 and Equation 7 cancel, mutual inductance between the first and second coil configurations is zero. Further, by combining and simplifying the two equations, it can be appreciated that the two voltages cancel out when a ratio of the first current to the second current is as follows:

$$\frac{I1}{I2}=\frac{L2-M}{L1-M} \qquad \text{Eq. 8}$$

In view of the following, to achieve decoupling between the first and second logical RF coils 124, 126, a ratio of current flow in the first physical RF coil 112 and the second physical RF coil 114 is controlled so Equation 8 is met. Such control may, for example, be achieved by the impedances of the matching circuitry (107a-d). For example, the intrinsic impedances of the quarter wavelength phase shifters (218a-d), the baluns (320a-320d), the matching elements (216a-d), or any combination of the foregoing may be adjusted to control the ratio of current in the first and second physical RF coils 112, 114.

In view of the foregoing discussion of FIGS. 4A and 4B, the matching circuits 107a-d are coupled to the first and second physical RF coils 112, 114 on the matching side 108 of the MRI RF array coil in parallel and antiparallel configurations to recreate the current patterns of the first and second coil configurations. As a result of this coupling, the logical RF coils (124, 126) are decoupled from each other.

Figure 5:
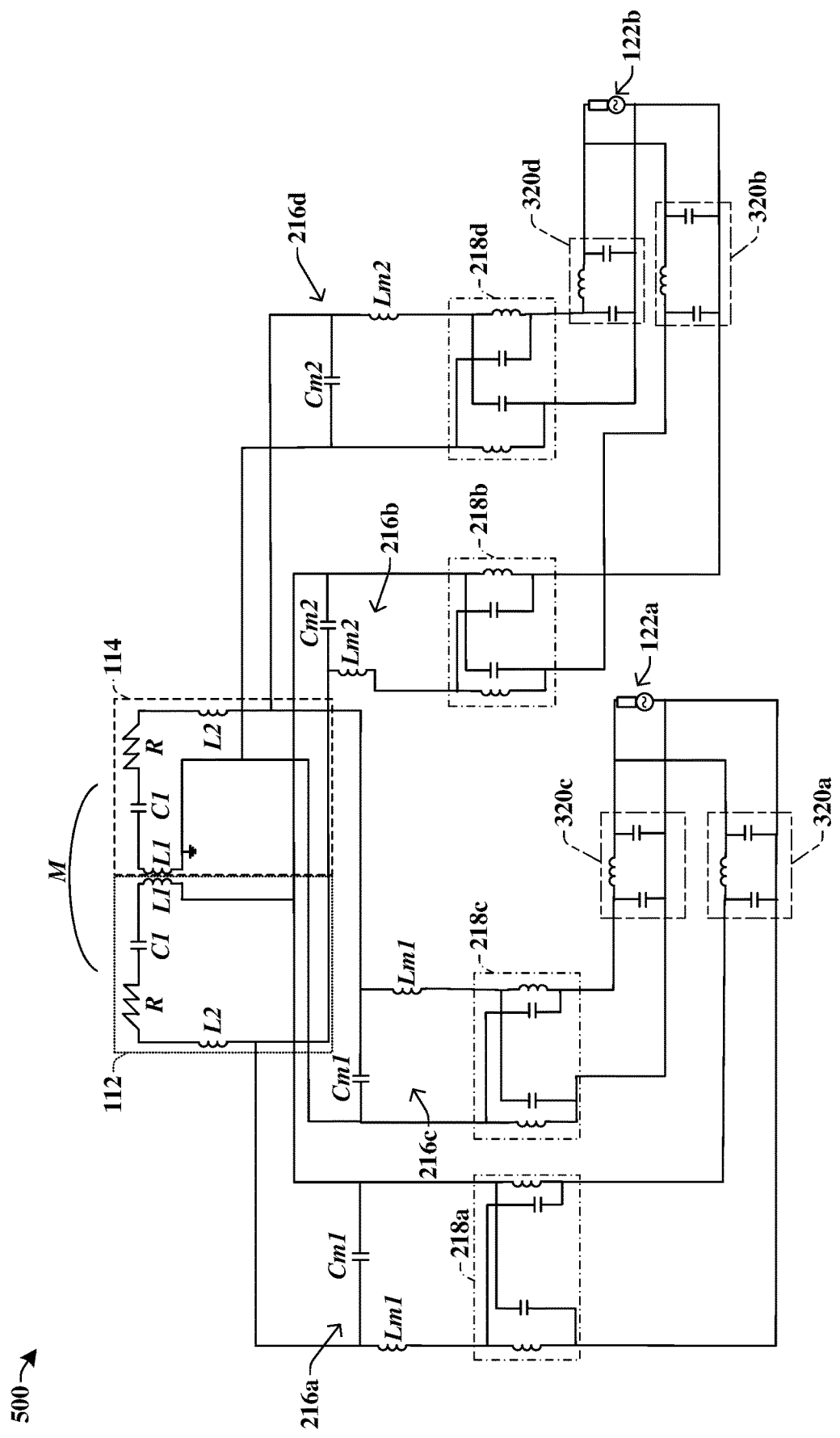
FIG. 5 illustrates a circuit diagram of some embodiments corresponding to the MRI RF array coil of FIG. 4A.

FIG. 5 illustrates a circuit diagram 500 of some embodiments of an MRI RF array coil corresponding to the schematic view 400A of FIG. 4A.

In some embodiments, the first and third matching elements 216a, 216c each comprise an inductor Lm1 and a capacitor Cm1 and each form a quarter wavelength line with an inductor L2. In some embodiments, the inductors (e.g., Lm1 and L2) share a common inductance, the capacitors (e.g., Cm1) share a common capacitance, and the inductors and the capacitors share a common impedance magnitude at the first resonant frequency at which the first logical RF coil resonates. In some embodiments, the second and fourth matching elements 216b, 216d each comprise an inductor Lm2 and a capacitor Cm2 and each form a quarter wavelength line with an inductor L2. In some embodiments, the inductors (e.g., Lm2 and L2) share a common inductance, the capacitors (e.g., Cm2) share a common capacitance, and the inductors and the capacitors share a common impedance magnitude at the second resonant frequency at which the second logical RF coil resonates.

Note that the inductors L2 vary by a resonant frequency at which the first and second physical RF coils 112, 114 resonate together. In particular, as described above, the first and second physical RF coils 112, 114 resonate together at a first resonant frequency, which corresponds to the first logical RF coil, and the first and second physical RF coils 112, 114 resonate together at a second resonant frequency, which corresponds to the second logical RF coil. Therefore, the inductors L2 have a first inductance at the first resonant frequency and a second, different inductance at the second resonant frequency. Because the inductors Lm1 and the capacitors Cm1 correspond to the first logical RF coil and hence the first resonant frequency, and the inductors Lm2 and the capacitors Cm2 correspond to second logical RF coil and hence the second resonant frequency, the inductors Lm1 and the capacitors Cm1 may have different inductances and capacitances, respectively, than the inductors Lm2 and the capacitors Cm2.

In some embodiments, the inductors of the quarter wavelength phase shifters 218a-d share a common inductance, and the capacitors of the quarter wavelength phase shifters 218a-d share a common capacitance. In some embodiments, the baluns 320a-d each comprise two capacitors and one inductor. In some embodiments, the inductors of the first and third baluns 320a, 320c share a common inductance, and the capacitors of the first and third baluns 320a, 320c share a common capacitance. In some embodiments, the inductors of the second and fourth baluns 320b, 320d share a common inductance different than the common inductance of the first and third baluns 320a, 320c, and the capacitors of the second and fourth baluns 320b, 320d share a common capacitance different than the common capacitance of the first and third baluns 320a, 320c. The first and second RF ports 122a, 122b in FIG. 5 comprise or are otherwise coupled (e.g., directly or indirectly) with amplifiers for Tx mode. In other embodiments, the first and second RF ports 122a, 122b comprise or are otherwise coupled (e.g., directly or indirectly) to low input impedance preamplifiers for Rx mode. It will be appreciated that other circuit configurations than what is described above and shown in FIG. 5 are also within the scope of this disclosure.

Figure 6:
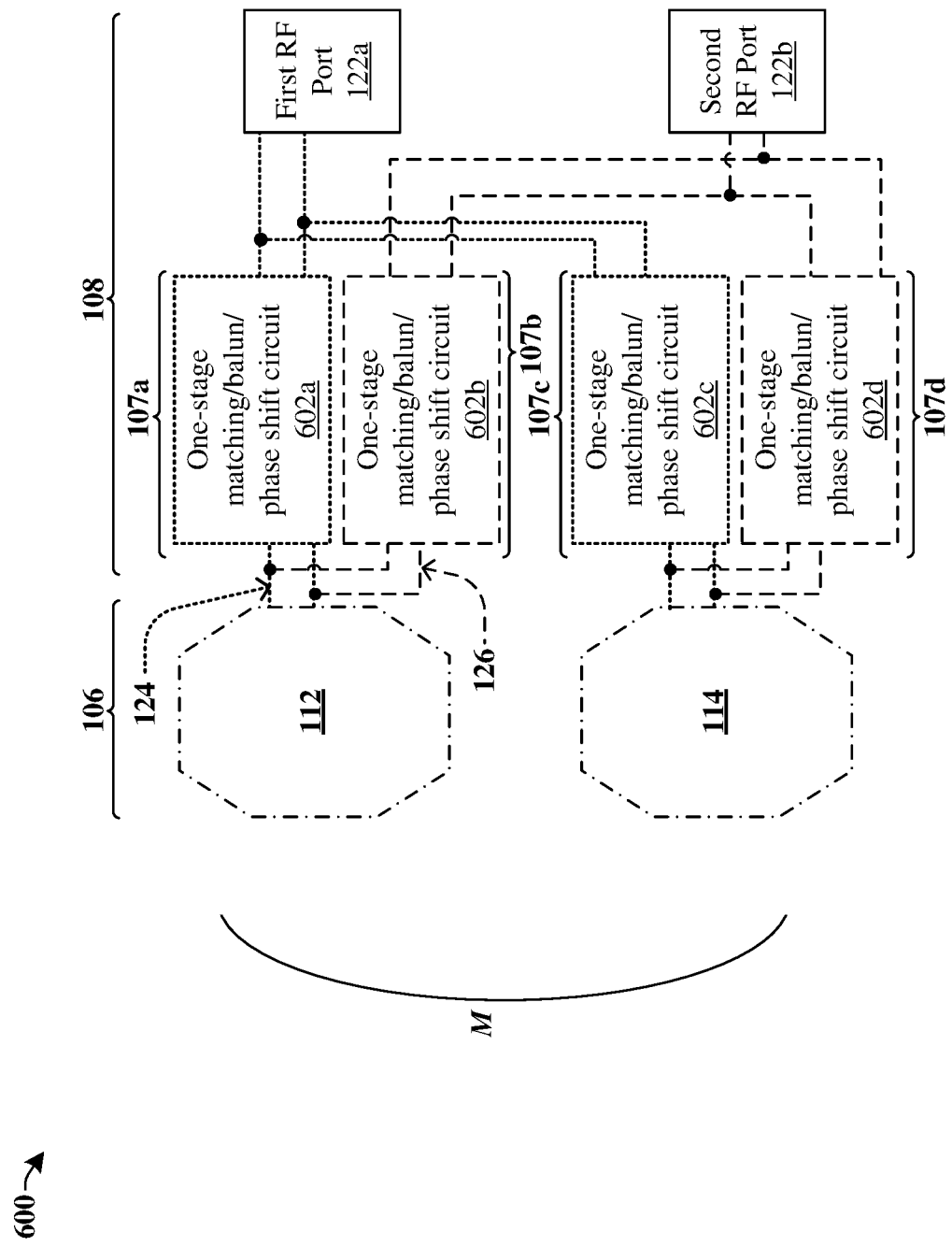
FIG. 6 illustrates a schematic view of yet some other embodiments of a MRI RF array coil comprising a first coil element coupled to a second coil element through inductive coupling and also through matching circuits.

FIG. 6 illustrates a schematic view 600 of some other embodiments of an MRI RF array coil comprising first and second physical RF coils coupled to first and second RF ports through matching circuits.

In FIG. 6, the first matching circuit 107a comprises a first one-stage matching/balun/phase shift circuit 602a coupled to the first physical RF coil 112; the second matching circuit 107b comprises a second one-stage matching/balun/phase shift circuit 602b coupled to the first physical RF coil 112; the third matching circuit 107c comprises a third one-stage matching/balun/phase shift circuit 602c coupled to the second physical RF coil 114; and the fourth matching circuit 107d comprises a fourth one-stage matching/balun/phase shift circuit 602d coupled to the second physical RF coil 114. The first and third one-stage matching/balun/phase shift circuits 602a, 602c are coupled to the first RF port 122a in a parallel configuration, whereas the second and fourth one-stage matching/balun/phase shift circuits 602b, 602d are coupled to the second RF port 122b in an anti-parallel configuration.

In view of the foregoing, the matching circuits 107a-d do not comprise matching elements (e.g., 216a-d in FIG. 3) or additional quarter wavelength phase shifters (e.g., 218a-d in FIG. 3). As such, the matching circuits 107a-d each have a single stage. In contrast, the matching circuits 107a-d of FIGS. 2 and 3 each have three stages. A stage may, for example, correspond to a circuit block providing impedance translation and/or phase shifting.

Because the matching circuits 107a-d of FIG. 6 each have a single stage, the MRI RF array coil of FIG. 6 takes up less space than the MRI RF array coils of FIGS. 2 and 3. However, because the matching circuits 107a-d of FIG. 6 have fewer stages, the MRI RF array coil of FIG. 6 has less degrees of freedom for impedance matching and translation than the MRI RF array coils of FIGS. 2 and 3. Therefore, the MRI RF array coil of FIG. 6 may not match and/or translate the impedance perfectly such that the first and/or second RF ports 122a, 122b may receive an impedance close to, but not equal to, the desired impedance value Z0. Nonetheless, it has been appreciated that the one-stage matching/balun/phase shift circuits 602a-d may still provide a sufficient impedance matching and/or translation function for a reliable signal.

For example, in some embodiments, the first and third one-stage matching/balun/phase shift circuits 602a, 602c may translate respectively from impedances of the first and second physical RF coils 112, 114 respectively to impedances that are close to (e.g., at least 50 percent of) the desired impedance value Z0 when combined in parallel. Similarly, in some embodiments, the second and fourth one-stage matching/balun/phase shift circuits 602b, 602d may translate respectively from impedances of the first and second physical RF coils 112, 114 respectively to impedances that are close to (e.g., at least 50 percent of) the desired impedance value Z0 when combined in antiparallel. Thus, even if the one-stage matching/balun/phase shift circuits 602a-d don't translate impedances that exactly yield the desired impedance Z0, the one-stage matching/balun/phase shift circuits 602a-d still improve the SNR of the signal by translating impedance values closer to the desired impedance value Z0.

Because the resonant frequencies of the first and second logical RF coils 124, 126 vary by impedances of the one-stage matching/balun/phase shift circuits 602a-d, this also means that the first and second logical RF coils 124, 126 may not resonate at frequencies exactly equal to a same working frequency. However, the first and second logical RF coils 124, 126 may resonate at frequencies closer to the working frequency, thereby increasing the SNR of the MRI RF array coil.

Figure 7:
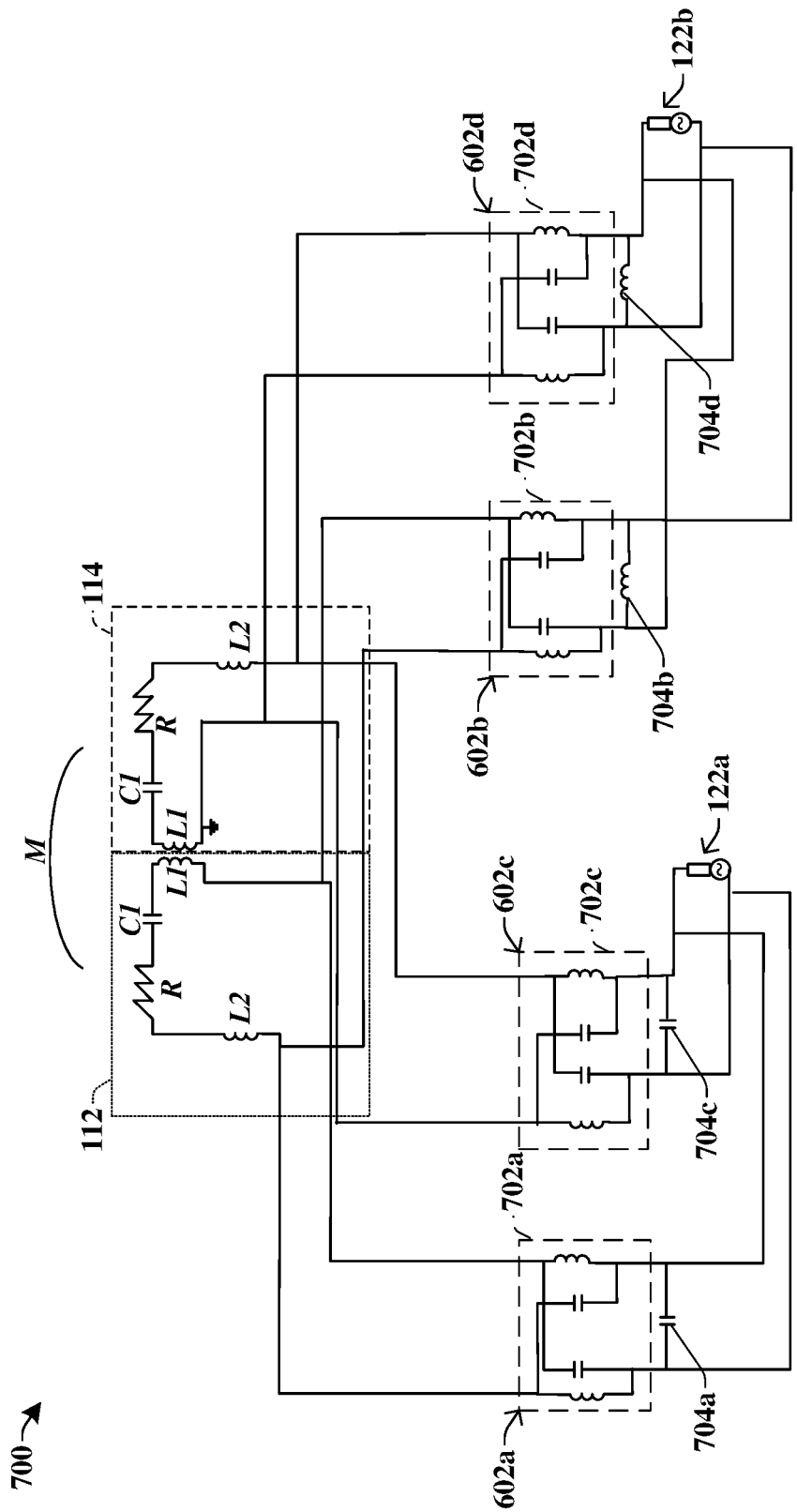
FIG. 7 illustrates a circuit diagram of some embodiments corresponding to the MRI RF array coil of FIG. 6.

FIG. 7 illustrates a circuit diagram 700 of some embodiments of an MRI RF array coil corresponding to the schematic view 600 of FIG. 6.

The first one-stage matching/balun/phase shift circuit 602a comprises a first lattice balun 702a and a first shunt capacitor or inductor 704a. A first input/output of the first lattice balun 702a is electrically coupled in parallel with the first physical RF coil 112, and a second input/output of the first lattice balun 702a is electrically coupled in parallel with the first shunt capacitor or inductor 704a. The second one-stage matching/balun/phase shift circuit 602a comprises a second lattice balun 702b and a second shunt capacitor or inductor 704b. A first input/output of the second lattice balun 702b is electrically coupled in parallel with the first physical RF coil 112, and a second input/output of the second lattice balun 702b is electrically coupled in parallel with the second shunt capacitor or inductor 704b. The third one-stage matching/balun/phase shift circuit 602c comprises a third lattice balun 702c and a third shunt capacitor or inductor 704c. A first input/output of the third lattice balun 702b is electrically coupled in parallel with the second physical RF coil 114, and a second input/output of the third lattice balun 702c is electrically coupled in parallel with the third shunt capacitor or inductor 704c. The fourth one-stage matching/balun/phase shift circuit 602d comprises a fourth lattice balun 702d and a fourth shunt capacitor or inductor 704d. A first input/output of the fourth lattice balun 702d is electrically coupled in parallel with the second physical RF coil 114, and a second input/output of the fourth lattice balun 702d is electrically coupled in parallel with the fourth shunt capacitor or inductor 704d. In some embodiments, the shunt capacitors or inductors (704a-d) may also be referred to as shunt reactive elements.

Each of the lattice baluns 702a-d comprises at least two capacitors and at least two inductors. In some embodiments, the inductors of the first and third lattice baluns 702a, 702c share a common inductance with each other and further with the inductors L2 at a first resonant frequency, and the capacitors of the first and third lattice baluns 702a, 702c share a common capacitance. In some embodiments, the inductors of the second and fourth lattice baluns 702b, 702d share a common inductance with each other further with the inductors L2 at a second resonant frequency, and the capacitors of the second and fourth lattice baluns 702b, 702d share a common capacitance. In some embodiments, the common inductance of the second and fourth lattice baluns 702b, 702d is different than the common inductance of the first and third lattice baluns 702a, 702c, and/or the common capacitance of the second and fourth lattice baluns 702b, 702d is different than the common inductance of the first and third lattice baluns 702a, 702c.

As noted above, inductances of the inductors L2 are different for the first and third lattice baluns 702a, 702c than for the second and fourth lattice baluns 702b, 702d because of differences in resonant frequency. The first and third lattice baluns 702a, 702c correspond to the first resonant frequency at which the inductors L2 have a first value, whereas the second and fourth lattice baluns 702b, 702d correspond to the second resonant frequency at which the inductors L2 have a second, different value. In some embodiments, the inductors of the first and third lattice baluns 702a, 702c, the capacitors of the first and third lattice baluns 702a, 702c, and the inductors L2 share a common impedance magnitude at the first resonant frequency. In some embodiments, the inductors of the second and fourth lattice baluns 702b, 702d, the capacitors of the second and fourth lattice baluns 702b, 702d, and the inductors L2 share a common impedance magnitude at the second resonant frequency.

In some embodiments, the lattice baluns 702a-d have impedance magnitudes that are the same as the individual impedance magnitudes of the corresponding capacitors and inductors at the corresponding resonant frequency (e.g., the first or second resonant frequencies discussed above). In some embodiments, the shunt capacitor or inductors 704a-d have impedance magnitudes that are the same or substantially the same as the corresponding lattice baluns 702a-d at the corresponding resonant frequency. In other words, in some embodiments, the shunt capacitor or inductors 704a-d have impedance magnitudes that are the same or substantially the same as the individual impedance magnitudes of the inductors and the capacitors of the corresponding lattice baluns 702a-d at the corresponding resonant frequency. In such embodiments, the shunt capacitor or inductors 704a-d provide matching. For example, the shunt capacitors or inductors 704a-d may cancel reactance of the corresponding lattice baluns 702a-d seen by the the shunt capacitors or inductors 704a-d. In some embodiments, the first and third shunt capacitors or inductors 704a, 704c are capacitors, whereas the second and fourth shunt capacitors or inductors 704b, 704d are inductors, or vice versa.

The first and second RF ports 122a, 122b in FIG. 7 comprise or are otherwise coupled (e.g., directly or indirectly) with amplifiers for Tx mode. In other embodiments, the first and second RF ports 122a, 122b comprise or are otherwise coupled (e.g., directly or indirectly) to low input impedance preamplifiers for Rx mode.

FIG. 8 illustrates a schematic 800 of some embodiments of an MRI RF array coil comprising three physical RF coils.

In some embodiments, if the second physical RF coil 114 is arranged between the first physical RF coil 112 and a third physical RF coil 806, there may be non-trivial mutual inductance M between the first and second physical RF coils 112, 114 and between the second and third physical RF coils 114, 806. Therefore, in some embodiments, the second physical RF coil 114 is coupled to the first physical RF coil 112 with first decoupling circuitry 810a, and the second physical RF coil 114 is coupled to the third physical RF coil 806 through second decoupling circuitry 810b. In some embodiments, the first decoupling circuitry 810a comprises a balun, a quarter wavelength phase shifter, matching elements, RF ports, or some other suitable decoupling circuitry elements as described above in FIGS. 1A-7. In some embodiments the second decoupling circuitry 810b comprises a balun, a quarter wavelength phase shifter, matching elements, RF ports, or some other suitable decoupling circuitry elements as described above in FIGS. 1A-7. In some other embodiments, the second physical RF coil 114 may overlap with the first physical RF coil 112 and/or the third physical RF coil 806 to further decouple the first, second, and third physical RF coils 112, 114, 806. It will be appreciated that other decoupling methods such as a capacitor approach or a transformer approach may also be implemented to further improve the isolation amongst the first, second, and third physical RF coils 112, 114, 806.

FIG. 9A illustrates a schematic view 900A of some other embodiments of an MRI RF array coil comprising four physical RF coils.

In FIG. 9A, the second physical RF coil 114 is arranged between and also partially overlaps with the first physical RF coil 112 and the third physical RF coil 806. The MRI RF array coil may further comprise a fourth physical RF coil 908 that overlaps the third physical RF coil 806 such that the third physical RF coil 806 is arranged between and overlaps with the second physical RF coil 114 and the fourth physical RF coil 908. In some embodiments, the schematic view 900A of FIG. 9A is a layout view, whereas in reality, the first, second, third, and fourth physical RF coils 112, 114, 806, 908 may be arranged in a cylindrical configuration. In a cylindrical configuration, the fourth physical RF coil 908 may overlap with the first physical RF coil 112, as represented by the dotted lines overlapping the first and fourth physical RF coils 112, 908.

Thus, in some embodiments with a cylindrical configuration, the first physical RF coil 112 is direct neighbors with and overlaps with the fourth and second physical RF coils 908, 114. At least due to the overlapping, the first physical RF coil 112, the second physical RF coil 114, and the fourth physical RF coil 908 are decoupled from one another. Similarly, the third physical RF coil 806 is direct neighbors with and overlaps with the second and fourth physical RF coils 114, 908. At least due to the overlapping, the third physical RF coil 806, the second physical RF coil 114, and the fourth physical RF coil 908 are decoupled from one another. However, the first and third physical RF coils 112, 806, which do not overlap with one another and are not nearest neighbors with one another, may achieve decoupling through the first decoupling circuitry 810a that is coupled to the first and third physical RF coils 806. Similarly, second decoupling circuitry 810b may be coupled to the second and fourth physical RF coils 114, 908 to decouple the second and fourth physical RF coils 114, 908 at least because the second and fourth physical RF coils 114, 908 do not achieve decoupling through overlap. Therefore, the first and second decoupling circuitries 810a, 810b each create first and second logical RF coils (e.g., 124, 126 of FIG. 1B) that are decoupled from each other. It will be appreciated that MRI RF array coils comprising more or less than four physical RF coils as illustrated in FIG. 9A are also within the scope of this disclosure.

FIG. 9B illustrates an axial view 900B extending in a B1 direction of some embodiments of the physical RF coils of FIG. 9A arranged in a cylindrical formation.

As shown in FIG. 9B, the physical RF coils of the schematic view 900A may be wrapped in a cylindrical formation 916 arranged around a center axis 914. In some such embodiments, the cylindrical formation 916 may be used to collect image data around various scan objects such as an arm, a leg, a head, and abdomen, or the like.

Figure 10:
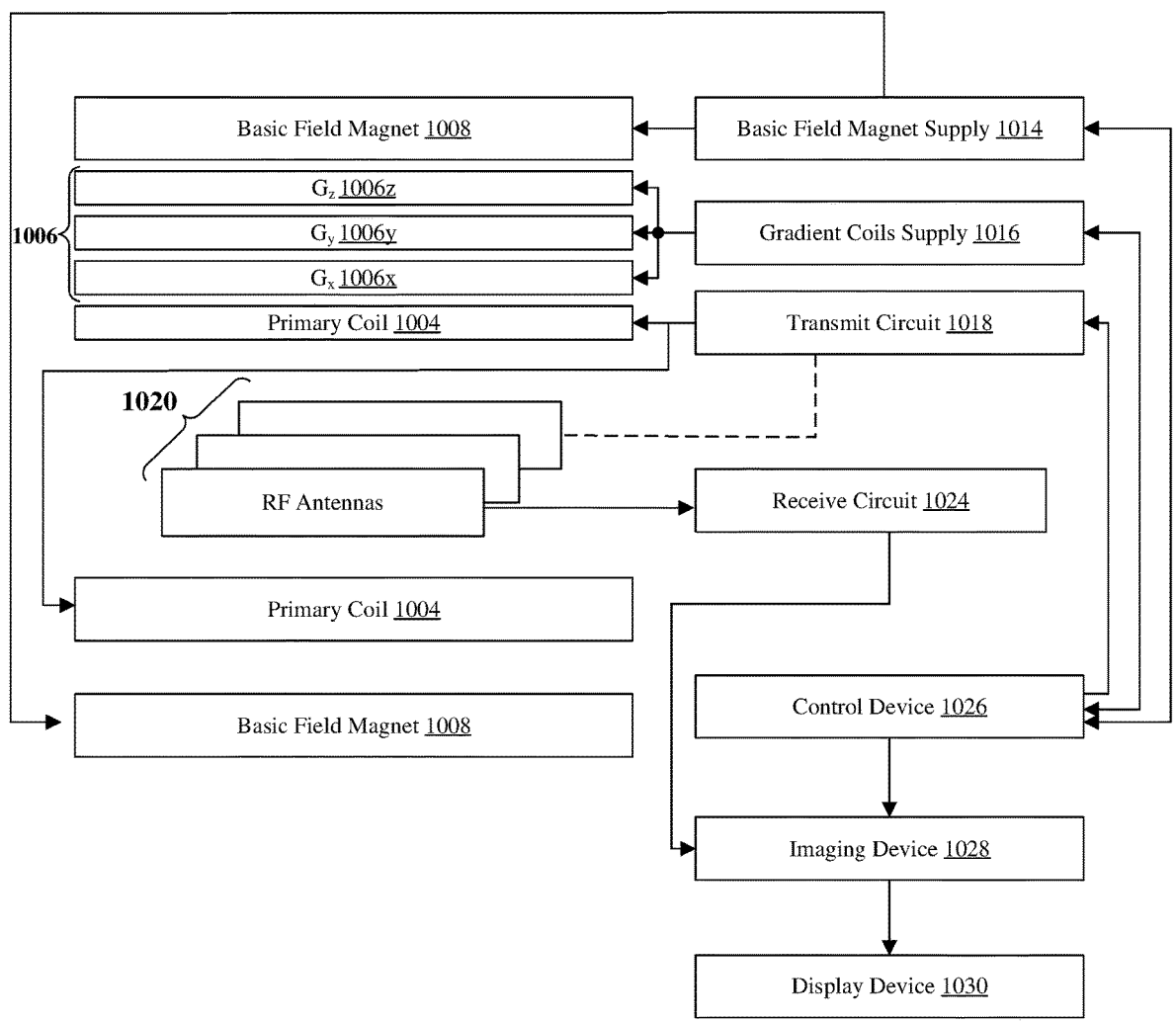
FIG. 10 illustrates a diagram of some embodiments of a MRI system.

FIG. 10 illustrates a schematic diagram of some embodiments of an MRI system 1000 that can be configured with, for example, MRI RF array coils, matching circuits, RF ports, or other circuitry according to one or more embodiments described herein.

The MRI system 1000 of FIG. 10 includes basic field magnet(s) 1008 and a basic field magnet supply 1014. Ideally, the basic field magnets 1008 would produce a uniform $B_0$ field. However, in practice, the $B_0$ field may not be uniform, and may vary over an object being imaged by the MRI system 1000. In some embodiments, the MRI system 1000 includes gradient coils 1006 configured to emit gradient magnetic fields like $G_x$ (e.g., via an associated gradient coil 1006), $G_y$ (e.g., via an associated gradient coil 1006) and $G_z$ (e.g., via an associated gradient coil 1006). The gradient coils 1006 can be controlled, at least in part, by a gradient coils supply 1016. In some examples, the timing, strength, and orientation of the gradient magnetic fields can be controlled, and thus selectively adapted during an MRI procedure.

In some embodiments, the MRI system 1000 includes a primary coil 1004 configured to generate RF pulses. In some embodiments, the primary coil 1004 is a whole body coil (WBC). In some embodiments, the primary coil 1004 comprises, for example, a birdcage coil. The primary coil 1004 can be controlled, at least in part, by a transmit circuit 1018, wherein the transmit circuit 1018 is configured to provide a signal to the primary coil 1004.

In some embodiments, the MRI system 1000 can include a set of RF antennas 1020 (e.g., one or more RF antennas). In some embodiments, the RF antennas 1020 can be configured to generate RF pulses and/or to receive resulting MR signals from an object (e.g., a body part) to which the RF pulses are directed. A RF antenna 1020 configured solely to generate RF pulses can be referred to herein as a Tx antenna (or coil or coil array). A RF antenna 1020 configured solely to receive resulting MR signals from an object to which the RF pulses are directed can be referred to herein as a Rx antenna (or coil or coil array). A RF antenna 1020 configured to both generate RF pulses and receive resulting MR signals can be referred to herein as a Tx/Rx antenna (or coil or coil array) or using a Tx/Rx switch. Unless otherwise indicated, antennas, coils, and coil arrays discussed herein can, in various embodiments, be any of a Tx antenna/coil/coil array, a Rx antenna/coil/coil array, or a Tx/Rx antenna/coil/coil array.

In some embodiments, RF antennas 1020 can be configured to inductively couple with primary coil 1004 and generate RF pulses and to receive resulting magnetic resonance signals from an object to which the RF pulses are directed. In other words, the RF antennas 1020 may be wirelessly coupled to a power source (e.g., a transmit circuit 1018) by inductive coupling with the primary coil 1004. In other embodiments, RF antennas 1020 can be wired to a power source (e.g., the transmit circuit 1018) that can drive the RF antennas 1020 to generate RF pulses, and RF antennas 1020 can also be configured to receive resulting MR signals from an object to which the RF pulses are directed. In one embodiment, one or more members of the set of RF antennas 1020 can be fabricated from flexible coaxial cable, or other conductive material. The set of RF antennas 1020 can be connected with a receive circuit 1024.

In various embodiments, a member of the set of RF antennas 1020 can be any example of the MRI RF array coils (e.g., FIGS. 1A, 1B, 2-9A, 9B) described herein. In other embodiments, one, some, or all members of the set of RF antennas 1020 can be any example of the MRI RF array coils (e.g., FIGS. 1A, 1B, 2-9A, 9B) described herein. In various embodiments, the set of RF antennas 1020 can include various combinations of example embodiments of phased array coils or MRI RF array coils arrays according to various embodiments described herein. When the RF antenna is configured to operate in Tx mode, the first and second RF ports (e.g., 122a, 122b of FIG. 1B), which are respectively coupled to the first and second logical RF coils (e.g., 124, 126 of FIG. 1B), comprise or are otherwise coupled with amplifiers. When the RF antenna is configured to operate in Rx mode, the first and second RF ports (e.g., 122a, 122b of FIG. 1B), which are respectively coupled to the first and second logical RF coils (e.g., 124, 126 of FIG. 1B), comprise or are otherwise coupled to low input impedance preamplifiers. In some other embodiments, the first and second RF ports (e.g., 122a, 122b of FIG. 1B) may be coupled to a Tx/Rx switch that controls whether the first and second RF ports (e.g., 122a, 122b of FIG. 1B) are coupled to amplifiers when the MRI RF array coil is in Tx mode or are coupled to low impedance preamplifiers when the MRI RF array coil is in Rx mode.

The gradient coils supply 1016 and the transmit circuit 1018 can be controlled, at least in part, by a control device 1026. The MR signals received from the set of RF antennas 1020 can be employed to generate an image, and thus can be subject to a transformation process like a two dimensional fast Fourier transform (FFT) that generates pixelated image data. The transformation can be performed by an imaging device 1028 or other similar processing device. The image data can then be shown on a display device 1030. In some embodiments, the receive circuit 1024 is connected the control device 1026 or the image device 1028.

In some embodiments, the control device 1026 can control the transmit circuit 1018 to directly drive the primary coil 1004 with a current, voltage, or a control signal. In some embodiments, the control device 1026 can control the transmit circuit 1018 to drive the MRI RF coil array directly. The MRI RF coil array in either of these embodiments may, for example, be a MRI RF array coil (e.g., FIGS. 1A, 1B, 2-9A, 9B) as described herein. In some embodiments, the MRI RF coil array is a whole body coil (WBC). In some embodiments, each element of the RF antennas 1020 may be individually controllable by the control device 1026. The control device 1026 can provide a DC bias current or control a DC bias control circuit to control the application of a DC bias current to elements of the RF antennas 1020. The MRI RF array coil (e.g., FIGS. 1A, 1B, 2-9A, 9B) also makes a good parallel transmit (pTx) coil. For example, in pTX, each logical RF coil (124, 126 of FIG. 1A) is electrically coupled and driven by an individual transmit circuit 1018.

Further, the MRI RF array coil (e.g., FIGS. 1A, 1B, 2-9A, 9B) may be implemented in single layer technology (SLT). For example, in SLT, each logical RF coil (124, 126 of FIG. 1A) inductively couples individually to the primary coil 1004 in Tx mode, and each logical RF coil (124, 126 of FIG. 1A) is electrically coupled to an individual one of the receive circuits 1024. In phase array receive mode, each logical RF coil (124, 126 of FIG. 1A) is electrically to an individual one of the receive circuits. Alternatively, phase shifters, splitters, etc. can connect the logical RF coils (124, 126 of FIG. 1A) to a common transmitter. Therefore, the MRI RF array coil (e.g., FIGS. 1A, 1B, 2-9A, 9B) can be combined with SLT technology as a Tx/Rx coil.

FIG. 11 illustrates a flow diagram of some embodiments of a method 1100 of conducting an MRI process using a MRI RF array coil comprising two inductively coupled physical RF coils that form logical RF coils that are decoupled.

While the method 1100 of FIG. 11 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1102, a MRI RF array coil is provided. The MRI RF array coil comprises: a first physical RF coil that is inductively coupled to a second physical RF coil, wherein the first and second physical RF coils have a first resonant frequency and a second resonant frequency; first matching circuitry coupling the first and second physical RF coils to a first RF port in a parallel configuration and configured to tune the first frequency to a first desired frequency at the first RF port; and second matching circuitry coupling the first and second physical RF coils to a second RF port in an anti-parallel configuration and configured to tune the second frequency to a second desired frequency at the second RF port. FIG. 1A illustrates a schematic view 100A of some embodiments corresponding to act 1102.

At act 1104, an MRI imaging process is performed using the MRI RF array coil. FIG. 2 illustrates a schematic view 200 of some embodiments correspond to act 1104.

Acts 1106-1116 provide a method of performing the MRI imaging process. At act 1106, a scan object is arranged in or proximate to the MRI RF array coil.

At act 1108, a $B_0$ magnetic field is applies to the scan object to align nuclei spinning in the scan object to the $B_0$ magnetic field.

At act 1110, gradient fields are applied to the scan object to select a portion of the scan object.

At act 1112, a $B_1$ magnetic field is applied to the scan object, wherein the $B_1$ magnetic field excites nuclei of the selected portion.

At act 1114, MR signals from the excited nuclei of the selected portion are received. The MRI RF array coil may apply the $B_1$ magnetic field and/or may receive the MR signals.

At act 1116, an image of the selected portion is generated using the received MRI signals.

Therefore, the present disclosure relates to an MRI RF array coil comprising first and second physical RF coils coupled to one another inductively and through matching circuits to form first and second logical RF coils that are decoupled to increase the SNR of the MRI RF array coil.

Accordingly, in some embodiments, the present disclosure relates to a magnetic resonance imaging (MRI) radio frequency (RF) array coil configured to operate in at least one of a transmit (Tx) mode or a receive (Rx) mode, the MRI RF array coil comprising: a first physical RF coil and a second physical RF coil inductively coupled together; a first matching circuit and a second matching circuit respectively coupled to the first physical RF coil and the second physical RF coil, wherein the first and second matching circuits are electrically coupled in a parallel configuration at a first RF port; a third matching circuit and a fourth matching circuit respectively coupled to the first physical RF coil and the second physical RF coil, wherein the third and fourth matching circuits are electrically coupled in an anti-parallel configuration at a second RF port; a first logical RF coil formed by the first and second physical RF coils and the first and second matching circuits, wherein the first logical RF coil is accessed via the first RF port; and a second logical RF coil formed by the first and second physical RF coils and the third and fourth matching circuits, wherein the second logical RF coil is accessed via the second RF port, and wherein the second local RF coil is decoupled from the first logical RF coil.

In other embodiments, the present disclosure relates to a magnetic resonance imaging (MRI) radio frequency (RF) array coil configured to operate in at least one of a transmit (Tx) mode or a receive (Rx) mode, the MRI RF array coil comprising: a first physical RF coil; a first matching circuit coupled to the first physical RF coil; a second matching circuit coupled to the first physical RF coil; a second physical RF coil inductively coupled to the first physical RF coil; a third matching circuit coupled to the second physical RF coil; a fourth matching circuit coupled to the second physical RF coil; a first RF port coupled to the first physical RF coil through the first matching circuit and coupled to the second physical RF coil through the third matching circuit, wherein the first and third matching circuits are coupled in parallel at the first RF port; and a second RF port coupled to the first physical RF coil through the second matching circuit and coupled to the second physical RF coil through the fourth matching circuit, wherein the second and fourth matching circuits are coupled in anti-parallel at the second RF port.

In yet other embodiments, the present disclosure relates to a method comprising: providing a magnetic resonance imaging (MRI) radio frequency (RF) array coil comprising at least: a first physical RF coil inductively coupled to a second physical RF coil, first matching circuitry coupling the first and second physical RF coils to a first RF port in a parallel configuration, and second matching circuitry coupling the first and second physical RF coils to a second RF port in an anti-parallel configuration; and performing an MRI imaging process on a scan target using the MRI array coil in a receive (Rx) mode and/or a transmit (Tx) mode, wherein the first and second physical RF coils resonant at a first frequency and a second frequency, wherein the first matching circuitry is configured to tune the first frequency to a first desired frequency at the first RF port, and wherein the second matching circuitry is configured to tune the second frequency to a second desired frequency at the second RF port.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic resonance imaging (MRI) radio frequency (RF) array coil configured to operate in at least one of a transmit (Tx) mode or a receive (Rx) mode, the MRI RF array coil comprising:
   a first physical RF coil and a second physical RF coil inductively coupled together;
   a first matching circuit and a third matching circuit respectively coupled to the first physical RF coil and the second physical RF coil, wherein the first and third matching circuits are electrically coupled in a parallel configuration at a first RF port;
   a second matching circuit and a fourth matching circuit respectively coupled to the first physical RF coil and the second physical RF coil, wherein the second and fourth matching circuits are electrically coupled in an anti-parallel configuration at a second RF port;
   a first logical RF coil formed by the first and second physical RF coils and the first and third matching circuits, wherein the first logical RF coil is accessed via the first RF port; and
   a second logical RF coil formed by the first and second physical RF coils and the second and fourth matching circuits, wherein the second logical RF coil is accessed via the second RF port, and wherein the second logical RF coil is decoupled from the first logical RF coil;
   wherein the first, second, third, and fourth matching circuits each includes two resonant-side terminals, wherein the two resonant-side terminals of the first matching circuit and the two resonant-side terminals of the second matching circuit are electrically coupled to a same two terminals of the first physical RF coil, and wherein the two resonant-side terminals of the third matching circuit and the two resonant-side terminals of the fourth matching circuit are electrically coupled to a same two terminals of the second physical RF coil.

2. The MRI RF array coil according to claim 1, wherein the first matching circuit comprises a matching capacitor and a matching inductor, and wherein the matching capacitor and the matching inductor are configured to tune a resonant frequency of the first logical RF coil and to translate an impedance of the first physical RF coil to an initial impedance.

3. The MRI RF array coil according to claim 2, wherein the first matching circuit comprises a first 90-degree phase shifter and a second 90-degree phase shifter electrically coupled in a cascading configuration from the first RF port to one of the matching capacitor and the matching inductor, wherein the one of the matching capacitor and the matching inductor is coupled from the first 90-degree phase shifter to a first terminal of the first physical RF coil, and wherein another one of the matching capacitor and the matching inductor is coupled from the first terminal to a second terminal of the first physical RF coil.

4. The MRI RF array coil according to claim 1, wherein the first physical RF coil and the second physical RF coil are configured to both resonate together at a first frequency and are configured to both resonate together at a second frequency, wherein the first and third matching circuits are configured to tune the first frequency to a working frequency at the first RF port, and wherein the second and fourth matching circuits are configured to tune the second frequency to the working frequency at the second RF port.

5. The MRI RF array coil according to claim 4, wherein the first and second matching circuits are configured to transform an impedance of the first physical RF coil to two-times a desired impedance, wherein the third and fourth matching circuits are configured to transform an impedance of the second physical RF coil to two-times the desired impedance, and wherein the first and second RF ports see the desired impedance.

6. The MRI RF array coil according to claim 1, wherein the first matching circuit comprises a lattice balun and a capacitor or inductor, wherein the lattice balun is electrically coupled from the first physical RF coil to the first RF port, wherein the capacitor or inductor is between the lattice balun and the first RF port and is electrically coupled from a first terminal of the first RF port to a second terminal of the first RF port, and wherein the capacitor or inductor is configured to cancel reactance of the lattice balun seen by the capacitor or inductor.

7. The MRI RF array coil according to claim 6, wherein the second matching circuit comprises a second lattice balun and a second capacitor or inductor, wherein the second lattice balun is electrically coupled from the first physical RF coil to the second RF port, wherein the second capacitor or inductor is between the second lattice balun and the second RF port and is electrically coupled from a first terminal of the second RF port to a second terminal of the second RF port, wherein the second capacitor or inductor is configured to cancel reactance of the second lattice balun seen by the second capacitor or inductor, and wherein the capacitor or inductor and the second capacitor or inductor are respectively a capacitor and an inductor.

8. The MRI RF array coil according to claim 1, wherein the parallel configuration configures the first and third matching circuits so current of the first logical RF coil flows in a same direction in the first and second physical RF coils, and wherein the anti-parallel configuration configures the second and fourth matching circuits so current of the second logical RF coil flows in opposite directions respectively in the first and second physical RF coils.

9. A magnetic resonance imaging (MRI) system comprising a MRI radio frequency (RF) array coil configured to operate in at least one of a transmit (Tx) mode or a receive (Rx) mode, the MRI RF array coil comprising:
a first physical RF coil;
a first matching circuit coupled to the first physical RF coil;
a second matching circuit coupled to the first physical RF coil;
a second physical RF coil inductively coupled to the first physical RF coil;
a third matching circuit coupled to the second physical RF coil;
a fourth matching circuit coupled to the second physical RF coil;
a first RF port coupled to the first physical RF coil through the first matching circuit and coupled to the second physical RF coil through the third matching circuit, wherein the first and third matching circuits are coupled in a parallel configuration at the first RF port; and
a second RF port coupled to the first physical RF coil through the second matching circuit and coupled to the second physical RF coil through the fourth matching circuit, wherein the second and fourth matching circuits are coupled in an anti-parallel configuration at the second RF port;
wherein the first matching circuit comprises a matching capacitor and a matching inductor, and further comprises a plurality of phase shifters, including a first 90-degree phase shifter, electrically coupled in a cascading configuration from the first RF port to one of the matching capacitor and the matching inductor, wherein the one of the matching capacitor and the matching inductor is coupled from the first 90-degree phase shifter to a first terminal of the first physical RF coil, and wherein another one of the matching capacitor and the matching inductor is coupled from the first terminal to a second terminal of the first physical RF coil.

10. The MRI system according to claim 9, further comprising:
a first logical RF coil formed by the first physical RF coil, the first matching circuit, the third matching circuit, and the second physical RF coil, wherein the first logical RF coil is accessed via the first RF port; and
a second logical RF coil formed by the first physical RF coil, the second matching circuit, the fourth matching circuit, and the second physical RF coil, wherein the second logical RF coil is accessed via the second RF port, and wherein the second logical RF coil is decoupled from the first logical RF coil.

11. The MRI system according to claim 10, wherein the matching capacitor and the matching inductor are configured to tune a resonant frequency of the first logical RF coil and to translate an impedance of the first physical RF coil to an initial impedance.

12. The MRI system according to claim 9, further comprising:
a third physical RF coil arranged between the first and second physical RF coils and overlapping with the first and second physical RF coils, wherein the overlapping is configured to decouple the third physical RF coil from the first and second physical RF coils.

13. The MRI system according to claim 9, wherein the first and third matching circuits are the same as each other, and wherein the second and fourth matching circuits are the same as each other but different than the first and third matching circuits.

14. The MRI system according to claim 9, wherein the first matching circuit and the second matching circuit are configured to translate a first signal across the first and second terminals of the first physical RF coil respectively to a first translated signal and a second translated signal, wherein the third matching circuit and the fourth matching circuit are configured to translate a second signal across two terminals of the second physical RF coil respectively to a third translated signal and a fourth translated signal, wherein the parallel configuration is configured so the first and third translated signals are additive at the first RF port, and wherein the anti-parallel configuration is configured so the second and fourth translated signals are subtractive at the second RF port.

15. A method comprising:
providing a magnetic resonance imaging (MRI) radio frequency (RF) array coil comprising at least: a first physical RF coil inductively coupled to a second physical RF coil; a first matching circuit and a third matching circuit that are respectively coupled to the first physical RF coil and the second physical RF coil and that are electrically coupled in a parallel configuration at a first RF port; and a second matching circuit and a fourth matching circuit that are respectively coupled to the first physical RF coil and the second physical RF coil and that are electrically coupled in an anti-parallel configuration at a second RF port; and
performing an MRI imaging process on a scan target using the MRI RF array coil in a receive (Rx) mode and/or a transmit (Tx) mode, wherein the first and second physical RF coils resonant at a first frequency and a second frequency, wherein the first and third matching circuits are configured to tune the first frequency to a first desired frequency at the first RF port, and wherein the second and fourth matching circuits are configured to tune the second frequency to a second desired frequency at the second RF port;
wherein the first physical RF coil, the first and third matching circuits, and the second physical RF coil form a first logical RF coil, wherein the first physical RF coil, the second and fourth matching circuits, and the second physical RF coil form a second logical RF coil, wherein the first logical RF coil and the second logical RF coil have different current patterns during the MRI imaging process that decouples the first and second logical RF coils, and wherein the performing of the MRI imaging process comprises transmitting RF signals into the scan target by driving the first and second logical RF coils in parallel respectively via the first and second RF ports.

16. The method of claim 15, wherein the first and second physical RF coils are coupled by a mutual inductance, wherein the first physical RF coil has a first inductance and a first current during the MRI imaging process, wherein the second physical RF coil has a second inductance and a second current during the MRI imaging process, and wherein a ratio of the first current to the second current is substantially equal to a ratio of a first inductance difference to a second inductance difference, wherein the first inductance difference is the second inductance less the mutual inductance, and wherein the second inductance difference is the first inductance less the mutual inductance.

17. The method according to claim 15, wherein the first matching circuit comprises a lattice balun and a capacitor or inductor, wherein the lattice balun is electrically coupled from the first physical RF coil to the first RF port, wherein the capacitor or inductor is between the lattice balun and the first RF port and is electrically coupled from a first terminal of the first RF port to a second terminal of the first RF port, and wherein the capacitor or inductor is configured to cancel reactance of the lattice balun seen by the capacitor or inductor.

18. The method according to claim 17, wherein the third matching circuit comprises a second lattice balun and a second capacitor or inductor, wherein the second lattice balun is electrically coupled from the second physical RF coil to the first RF port, wherein the second capacitor or inductor is between the second lattice balun and the first RF port and is electrically coupled from the first terminal of the first RF port to the second terminal of the first RF port, and wherein the second capacitor or inductor is configured to cancel reactance of the second lattice balun seen by the second capacitor or inductor.

19. The method according to claim 15, wherein the parallel configuration electrically couples signals respectively from the first and second physical RF coils in parallel with a phase difference of zero at the first RF port, and wherein the anti-parallel configuration electrically couples signals respectively from the first and second physical RF coils in parallel with a phase difference of 180 degrees at the second RF port.

20. The method of claim 15, wherein the performing of the MRI imaging process uses the MRI RF array coil in the Rx mode.

* * * * *